(12) United States Patent
Hirano

(10) Patent No.: US 8,742,596 B2
(45) Date of Patent: Jun. 3, 2014

(54) SEMICONDUCTOR DEVICE AND METHOD FOR MANUFACTURING SAME

(75) Inventor: Takaaki Hirano, Kanagawa (JP)

(73) Assignee: Sony Corporation, Tokyo (JP)

( * ) Notice: Subject to any disclaimer, the term of this patent is extended or adjusted under 35 U.S.C. 154(b) by 168 days.

(21) Appl. No.: 13/416,419

(22) Filed: Mar. 9, 2012

(65) Prior Publication Data

US 2012/0241981 A1    Sep. 27, 2012

(30) Foreign Application Priority Data

Mar. 24, 2011    (JP) .................................. 2011-065493
Mar. 24, 2011    (JP) .................................. 2011-065494

(51) Int. Cl.
*H01L 23/488*    (2006.01)
*H01L 21/50*    (2006.01)

(52) U.S. Cl.
USPC ............ 257/777; 257/E21.499; 257/E23.023; 257/E25.006; 257/E25.017; 257/E25.018; 257/E25.027; 438/107

(58) Field of Classification Search
USPC ........... 257/777, E23.023, E25.006, E25.017, 257/E25.018, E25.027, E21.499; 438/107
See application file for complete search history.

(56) References Cited

U.S. PATENT DOCUMENTS

| 6,559,531 | B1 * | 5/2003 | Sutherland | 257/686 |
| 2011/0031633 | A1 * | 2/2011 | Hsu et al. | 257/777 |
| 2011/0193197 | A1 * | 8/2011 | Farooq et al. | 257/618 |

FOREIGN PATENT DOCUMENTS

| JP | 11-261000 | 9/1999 |
| JP | 2006-140404 | 6/2006 |

OTHER PUBLICATIONS

V. Suntharalingam, et al., "A 4-Side Tileable Back Illuminated 3D-Integrated Mpixel CMOS Image Sensor," ISSCC 2009, Session 2, pp. 38-39.

* cited by examiner

*Primary Examiner* — Peniel M Gumedzoe
(74) *Attorney, Agent, or Firm* — Rader, Fishman & Grauer PLLC

(57) ABSTRACT

Disclosed herein is a semiconductor device including: a first laminate having a wiring layer formed on a substrate; a second laminate having a wiring layer formed on a substrate, a principal surface of the second laminate being bonded to a principal surface of the first laminate; a functional element disposed in at least one of the first laminate and the second laminate; and an air gap penetrating an interface between the first laminate and the second laminate, the air gap being disposed on an outside of a circuit formation region including the functional element in at least one of the first laminate and the second laminate as viewed from a direction perpendicular to the principal surfaces of the first laminate and the second laminate.

12 Claims, 13 Drawing Sheets

SEMICONDUCTOR DEVICE AND METHOD FOR MANUFACTURING SAME

BACKGROUND

The present disclosure relates to a semiconductor device having a multilayer structure and a method for manufacturing the semiconductor device.

In trends of semiconductor miniaturization, attention has recently been directed to a beyond-Moore approach, which stacks elements in a vertical direction with respect to a substrate and connects wiring three-dimensionally, in place of a more-Moore approach aimed at a higher degree of integration by further miniaturization in mask processes.

Lamination in a three-dimensional direction can reduce RC between elements, and enables cost reduction when the development of package technology at a wafer level makes progress.

For example, Japanese Patent Laid-Open No. Hei 11-261000 discloses first forming buried wiring in a wafer of a first layer and exposing the buried wiring by grinding a Si substrate after ending a wafer process. Then, bumps are formed on the exposed wiring, and the wafer of the first layer is laminated to a wafer of a second layer which wafer is fabricated in a similar manner. An electric connection between the first layer and the second layer is established via the bumps.

In addition, "A 4-side tileable back illuminated 3D-integrated Mpixel CMOS image sensor," Suntharalingam, V.; Berger, R.; Clark, S.; Knecht, J.; Messier, A.; Newcomb, K.; Rathman, D.; Slattery, R.; Soares, A.; Stevenson, C.; Warner, K.; Young, D.; Lin Ping Ang; Mansoorian, B.; Shaver, D.; ISSCC 2009, discloses a method that makes a hole so as to be in contact with or penetrate a conductive pad section provided in advance within each of wafers after laminating circuits to each other, and establishes an electric connection between the wafers by burying a conductive material in the hole.

Some semiconductor devices have a structure referred to as a seal ring or a guard ring formed in a peripheral section of a chip in order to prevent damage to the devices due to cracks occurring when the semiconductor devices are divided into individual pieces or prevent the intrusion of water from side surfaces into the devices.

A seal ring is for example composed of wiring in a multilayer wiring region formed by alternately disposing insulating layers and wiring layers on a semiconductor element and a connecting part for connecting each of these pieces of wiring, the connecting part penetrating the interlayer insulating films.

For example, Japanese Patent Laid-Open No. 2006-140404 discloses disposing a seal ring in a wiring layer and forming a groove penetrating a protective film and reaching a position between a low dielectric constant film and the protective film on the outside of the seal ring. This is intended to prevent the development of cracks occurring when a wafer of a structure including the low dielectric constant interlayer film is diced, by this groove and the seal ring. Peeling at the time of the dicing is purported to be thereby prevented.

SUMMARY

In a method of performing wiring three-dimensionally as in the method disclosed in Japanese Patent Laid-Open No. Hei 11-261000, elements are laminated in a vertical direction with respect to a substrate. Thus, the thickness itself of the device is larger than in the past, so that a dicing time is increased and an impact on the device at the time of the dicing may be increased. Therefore, cracks may tend to occur, and the cracks need to be prevented more surely.

In addition, when wiring is performed three-dimensionally, a plurality of device regions are formed in a vertical direction with respect to a principal surface of a substrate, so that each of the regions needs to be protected. However, the method disclosed in the above Japanese Patent Laid-Open No. 2006-140404 does not consider this, and is thus not technically satisfactory.

In view of points as described above, it is desirable to provide a semiconductor device and a method for manufacturing the semiconductor device that can prevent the development of cracks even when elements are arranged three-dimensionally.

A semiconductor device according to an embodiment of the present disclosure includes a first laminate having a wiring layer formed on a substrate and a second laminate having a wiring layer formed on a substrate, a principal surface of the second laminate being bonded to a principal surface of the first laminate.

The semiconductor device according to the embodiment of the present disclosure also includes a functional element disposed in at least one of the first laminate and the second laminate.

Then, an air gap penetrating an interface between the first laminate and the second laminate is disposed on an outside of a circuit formation region of the first laminate and the second laminate as viewed from a direction perpendicular to the principal surfaces of the first laminate and the second laminate.

A method for manufacturing a semiconductor device according to an embodiment of the present disclosure is a method for manufacturing the above-described semiconductor device. The method for manufacturing the semiconductor device first forms a first laminate having a wiring layer formed on a substrate, a second laminate having a wiring layer formed on a substrate, and a functional element disposed in at least one of the first laminate and the second laminate.

Thereafter, a principal surface of the first laminate and a principal surface of the second laminate are bonded to each other. Then, a groove penetrating an interface between the first laminate and the second laminate and having an opening in a principal surface of one of the first laminate and the second laminate, the principal surface being on an opposite side from the bonded surface of one of the first laminate and the second laminate, is disposed on an outside of a circuit formation region of the first laminate and the second laminate.

Another method for manufacturing a semiconductor device forms a first laminate having a wiring layer formed on a substrate, a second laminate having a wiring layer formed on a substrate, and a functional element disposed in at least one of the first laminate and the second laminate.

Thereafter, a groove is formed in a principal surface of the first laminate and a groove is formed in a principal surface of the second laminate on an outside of a circuit formation region of the first laminate and the second laminate. Then, alignment is performed such that the groove disposed in the first laminate and the groove disposed in the second laminate communicate with each other, and the principal surfaces of the first laminate and the second laminate are bonded to each other.

According to the semiconductor device and the method for manufacturing the semiconductor device in accordance with the embodiments of the present disclosure, the air gap penetrating the interface between the first laminate and the second laminate is disposed on the outside of the circuit formation region.

Therefore, a crack that has propagated through the interface between the first laminate and the second laminate can be made to reach the air gap on the outside of the circuit formation region.

According to the semiconductor device and the method for manufacturing the semiconductor device in accordance with the embodiments of the present disclosure, a crack that has propagated through the interface between the first laminate and the second laminate is made to reach the air gap, whereby the stress of the crack can be released. Therefore, the crack can be prevented from developing into the circuit formation region on the inside of the position where the air gap is disposed.

DETAILED DESCRIPTION OF THE PREFERRED EMBODIMENTS

An example of modes for carrying out the present disclosure will hereinafter be described. However, the present disclosure is not limited to the following examples. Incidentally, in the present disclosure, air gaps penetrating a bonding surface include air gaps having one end thereof coinciding with the bonding surface (interface).

Figure 1:
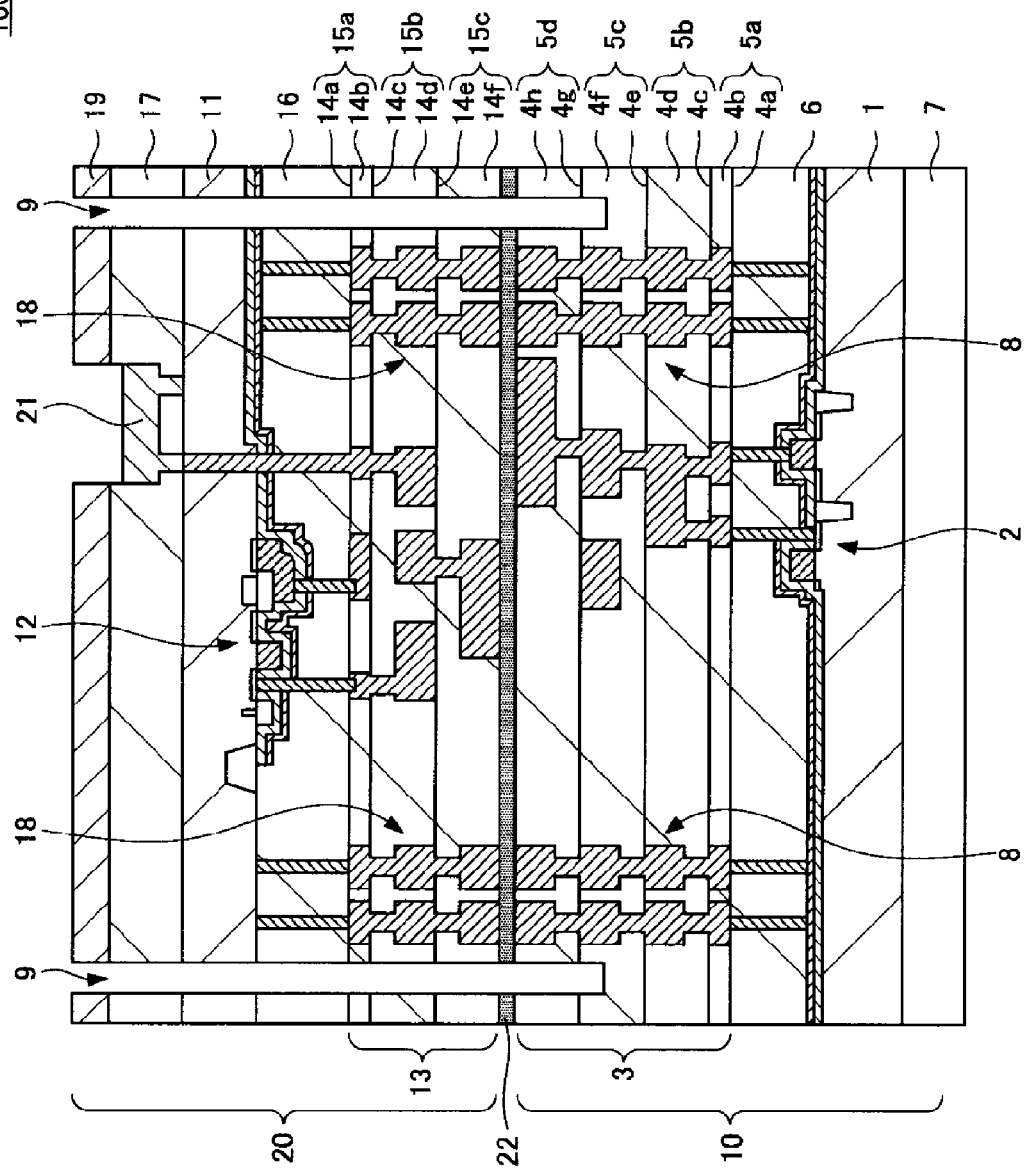
FIG. 1 is a schematic sectional view of a semiconductor device according to a first embodiment of the present disclosure.

Description will be made in the following order.
1. First Embodiment (Example of Providing Groove Penetrating Bonding Surface)
2. First Example of Modification (Example of Different Bonding Surface)
3. Second Example of Modification (Example of Bonding Three or More Laminates)
4. Second Embodiment (Example of Providing Air Gap Reaching Wiring)
5. Third Embodiment (Example of Forming Seal Ring by Electrode Penetrating Substrate)
6. Fourth Embodiment (Example of Same Etching Stopper for Air Gap and Penetrating Metallic Member)
7. Fifth Embodiment (Example of Providing Air Gap Only in Proximity to Bonding Surface)
1. First Embodiment (Example of Providing Groove Penetrating Bonding Surface)
1-1. Constitution of Semiconductor Device FIG. 1 is a schematic sectional view of a semiconductor device 100 according to a first embodiment. The semiconductor device 100 according to the first embodiment includes a first laminate 10 having a functional element 2 and a wiring layer 3 formed on a substrate 1 and a second laminate 20 having a functional element 12 and a wiring layer 13 formed on a substrate 11.

A Si substrate or a glass substrate, for example, can be used as the substrate 1, or the substrate 1 may be formed by another substrate of metal.

The functional element 2 is formed on a principal surface of the substrate 1. The functional element 2 is not limited to a transistor, for example. Various elements desired to be protected by a seal ring 8 to be described later, such as a MEMS actuator, a sensor element, and the like, may be disposed on the substrate 1.

Incidentally, an insulating film 7 of $SiO_2$, SiN, SiON, or TEOS, for example, is disposed on a principal surface of the substrate 1 which principal surface is on an opposite side from the surface on which the functional element 2 is disposed, so that insulation of the substrate 1 is secured.

A wiring layer 3 is disposed on the substrate 1 and the functional element 2 with a planarizing film (insulating film) 6 made of $SiO_2$, NSG (Nondoped Silicate Glass), PSG (Phospho Silicate Glass), or TEOS (Tetraethyl orthosilicate), for example, interposed between the wiring layer 3 and the substrate 1 and the functional element 2. The wiring layer 3 in this case has a multilayer wiring structure formed by sequentially laminating a first wiring layer 5a, a second wiring layer 5b, a third wiring layer 5c, and a fourth wiring layer 5d, for example. Wiring is embedded in each of the layers. Materials for the wiring include for example W, Al, and Cu.

SiCN and SiN, for example, are used for interlayer insulating films 4a, 4c, 4e, and 4g in the respective wiring layers. Low dielectric constant materials such as organosilica glass and the like and SiO$_2$, for example, are used for interlayer insulating films 4b, 4d, 4f, and 4h.

In addition, in a peripheral position of the functional element 2 as viewed from a direction perpendicular to the principal surfaces of the substrate 1, the pieces of wiring in the first to fourth wiring layers 5a to 5d are connected to each other, and a seal ring 8 is formed so as to enclose the functional element 2.

This seal ring 8 prevents a crack from developing to a region where the functional element 2 is formed, and thus protects the functional element 2. A material for forming the seal ring 8 desirably has high resistance to immersion in order to protect the functional element 2. For example, W, Al, Cu, Ta, Ti, TiN, and the like cited as the above-described wiring materials can be used as material for forming the seal ring 8.

The second laminate 20 includes the substrate 11 and the functional element 12 and the wiring layer 13 formed on the principal surface of the substrate 11.

As with the substrate 1, the substrate 11 is not particularly limited. A Si substrate, a glass substrate, or another metallic substrate, for example, may be used as the substrate 11.

In addition, as with the functional element 2, the functional element 12 is not particularly limited. Various elements other than a transistor may be disposed as the functional element 12.

A planarizing film (insulating film) 16 made of SiO$_2$, NSG, PSG, or TEOS, for example, is formed on the principal surface of the substrate 11, on which principal surface the functional element 12 is formed, and on the functional element 12. A wiring layer 13 is formed on the planarizing film 16. The wiring layer 13 has a multilayer wiring structure formed by a first wiring layer 15a, a second wiring layer 15b, and a third wiring layer 15c. Wiring is formed in each of the wiring layers.

Low dielectric constant materials such as organosilica glass and the like and SiO$_2$, for example, are used for interlayer insulating films 14b, 14d, and 14f. SiCN and SiN, for example, are used for interlayer insulating films 14a, 14c, and 14e in the respective wiring layers.

A seal ring 18 is disposed on the periphery of the functional element 12 as viewed from a direction perpendicular to the principal surfaces of the substrate 11. The seal ring 18 is formed such that the wiring in the wiring layer 13 encloses the functional element 12. The seal ring 18 protects the functional element 12 from cracks. As for the seal ring 8, W, Al, Cu, Ta, Ti, TiN, and the like can be used for the seal ring 18.

In addition, an insulating film 17 of SiO$_2$, SiN, or TEOS, for example, is formed on a principal surface of the substrate 11 which principal surface is on an opposite side from the surface on which the functional element 12 is formed. A terminal 21 of Al or the like used for connection to an outside, for example, is disposed on the insulating film 17 so as to be embedded in the insulating film 17. In addition, a passivation film 19 of a resin, for example, is formed on the insulating film 17.

The principal surface of the first laminate 10 on the side of the wiring layer 3 is superposed on the principal surface of the second laminate 20 on the side of the wiring layer 13. The first laminate 10 and the second laminate 20 are bonded to each other at an interface where the principal surface of the first laminate 10 on the side of the wiring layer 3 is superposed on the principal surface of the second laminate 20 on the side of the wiring layer 13.

This bonding may be performed by an adhesive layer 22 by applying a coating of an adhesive such as a resin or the like, or may be performed by using various appropriate methods such as plasma bonding, metal bonding, glass anodic bonding, and the like. A constitution such that the first laminate 10 and the second laminate 20 are electrically connected to each other at the time of the bonding may be adopted, or a constitution such that the first laminate 10 and the second laminate 20 are not electrically connected to each other at the time of the bonding may be adopted.

The semiconductor device 100 in the present embodiment has an air gap 9 penetrating the interface between the first laminate 10 and the second laminate 20. Incidentally, in this case, the interface between the first laminate 10 and the second laminate 20 is the bonding surfaces of the first laminate 10 and the second laminate 20. The air gap 9 according to the present embodiment forms a groove penetrating the second laminate 20 and having an opening in the principal surface of the second laminate 20 which principal surface is on the opposite side from the bonding surface of the second laminate 20.

In addition, the air gap 9 is formed on the outside of a circuit formation region including the functional element 2 and the functional element 12, that is, on the outside of the seal ring 8 and the seal ring 18 as viewed from a direction perpendicular to the principal surface of the first laminate 10 or the second laminate 20.

Thus providing the air gap 9 penetrating the interface between the first laminate 10 and the second laminate 20 on the outside of the circuit formation region to be protected can prevent cracks from developing into the circuit formation region to be protected.

Figure 2:
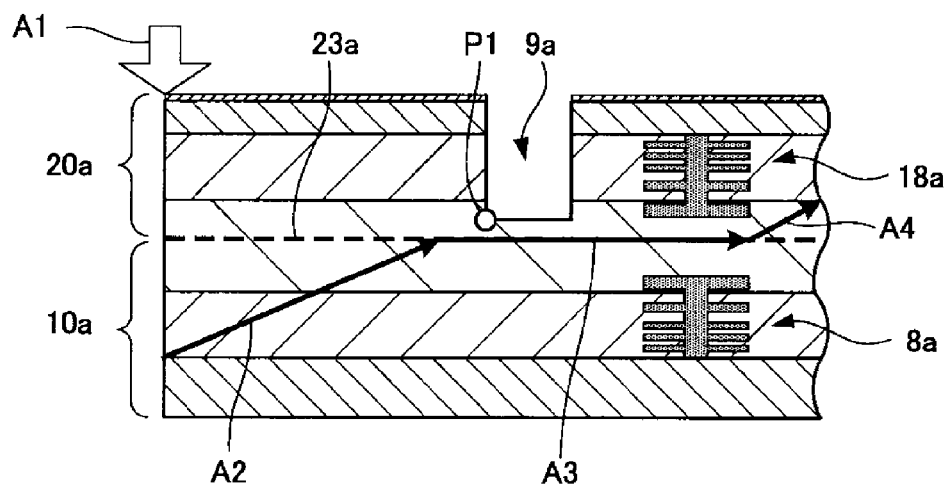
FIG. 2 is a diagram of assistance in explaining the development of a crack in a semiconductor device according to an example of comparison.

For example, FIG. 2 is a schematic sectional view of a semiconductor device 110 having an air gap 9a that does not penetrate the bonding surfaces of a first laminate 10a and a second laminate 20a. Description will be made by using this schematic sectional view as an example of comparison.

The semiconductor device 110 has a seal ring 8a of the first laminate 10a and a seal ring 18a of the second laminate 20a, the seal ring 8a and the seal ring 18a enclosing a predetermined circuit formation region, and the air gap 9a situated on the outside of the seal rings 8a and 18a. However, the air gap 9a does not penetrate the bonding surfaces of the first laminate 10a and the second laminate 20a. The bottom surface of the groove formed by the air gap 9a is situated within the second laminate 20a.

For example, the semiconductor device 110 having the side of the first laminate 10a mounted on a dicing lane has a load applied in a direction indicated by an arrow A1, for example, at a time of dicing. Suppose that a crack has thereby occurred on the side of the first laminate 10a. Then, because stress concentrates on the bottom surface of the groove formed by the air gap 9a, the crack develops toward a point P1 nearest to the position of occurrence of the crack in the bottom surface of the groove formed by the air gap 9a, as indicated by an arrow A2.

Then, when the crack reaches bonding surfaces 23a of the first laminate 10a and the second laminate 20a, and the bonding surfaces 23a do not have a sufficient strength, the bonding surfaces are peeled from each other, and the crack propagates through the bonding surfaces 23a, as indicated by an arrow A3. By propagating through the bonding surfaces 23a, the crack may pass the seal rings 8a and 18a, and develop to the circuit formation region on the inside of the seal rings 8a and 18a, as indicated by an arrow A4.

Figure 3:
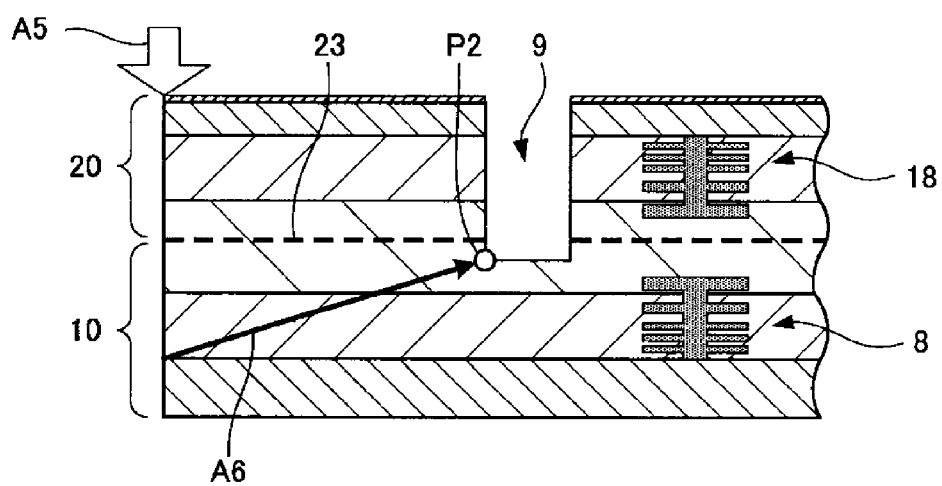
FIG. 3 is a diagram of assistance in explaining the prevention of the development of a crack in the semiconductor device according to the first embodiment.

On the other hand, FIG. 3 is a schematic sectional view representing a case of a crack occurring when the semiconductor device 100 according to the present embodiment is diced. The first laminate 10 and the second laminate 20 of the semiconductor device 100 are bonded to each other at the bonding surfaces 23. In addition, the seal rings 8 and 18 are arranged so as to enclose the circuit formation region desired to be protected, and the air gap 9 penetrating the bonding surfaces 23 is formed on the outside of the seal rings 8 and 18.

When the side of the first laminate 10 is mounted on a dicing lane, and dicing is performed at the position of an arrow A5, a load is applied in the direction of the arrow A5, for example, and a crack may occur on the side of the first laminate 10.

In the present embodiment, the semiconductor device 100 is thinned at the position of the air gap 9, and vulnerability is imparted to this position. Therefore, when the crack occurs at the dicing position, stress concentrates on a point P2 nearest to the position of occurrence of the crack in the bottom surface of the groove formed by the air gap 9. Thus, the crack develops toward the point P2, as indicated by an arrow A6.

When the crack reaches the point P2, the stress is released by the air gap 9, so that the crack does not develop further. Thus, in the semiconductor device 100 according to the present embodiment, because the air gap 9 penetrates the bonding surfaces 23 of the first laminate 10 and the second laminate 20, the crack can be prevented from reaching the bonding surfaces 23, and the crack can be prevented from propagating through the bonding surfaces 23.

Besides, even when a crack reaches the bonding surfaces 23 in a position on the outside of the air gap 9 with respect to the circuit formation region desired to be protected, the crack developing along the bonding surfaces 23 eventually reaches the air gap 9 because the air gap 9 penetrates the bonding surfaces 23. Thus, the crack can be prevented from passing the seal rings 8 and 18 and developing to the inside of the circuit formation region.

Incidentally, even when one end of the air gap 9, or the bottom surface of the groove formed by the air gap 9 in this case coincides with the bonding surfaces 23, the development of a crack can be similarly prevented because stress is released when the crack reaches the bottom surface of the groove.

This air gap 9 is desirably disposed so as to enclose the circuit formation region desired to be protected in the semiconductor device 100 as viewed from the direction perpendicular to the principal surface of the semiconductor device 100 (the first laminate 10 or the second laminate 20).

FIGS. 4A to 4E are schematic diagrams of assistance in explaining an example of patterns of formation of the air gap 9. Incidentally, FIGS. 4A to 4E show states as viewed from the principal surface of the semiconductor device 100.

Figure 4A:
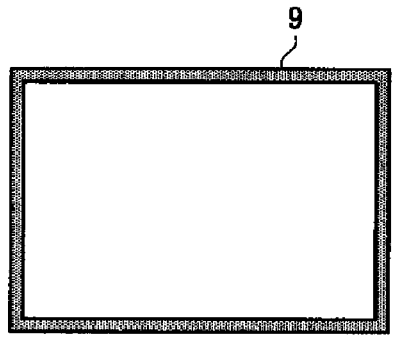
FIGS. 4A to 4E are diagrams of assistance in explaining arrangement patterns of an air gap in the semiconductor device according to the first embodiment.

As shown in FIG. 4A, the air gap may be provided on the outside of the seal rings 8 and 18 (not shown) so as to be continuous without a break in the form of a closed circuit enclosing the circuit formation region of the semiconductor device 100. This can more reliably prevent a crack occurring on the outside of the air gap 9 from developing to the inside of the region enclosed by the air gap 9.

Figure 4B:
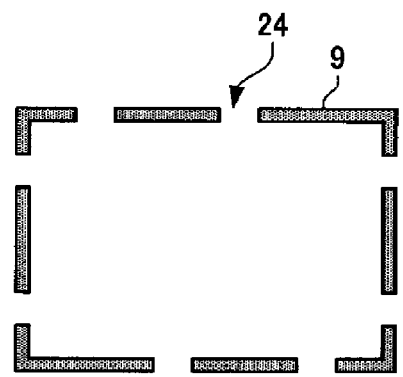

On the other hand, as shown in FIG. 4B, the air gap 9 may be formed in the shape of a broken line formed by providing breaks to a closed circuit enclosing the seal rings 8 and 18. In this case, wiring can be disposed at the positions of breaks 24 of the air gap 9, and lead wiring or the like for connecting the semiconductor device 100 to an external device, for example, can be provided easily.

Figure 4C:
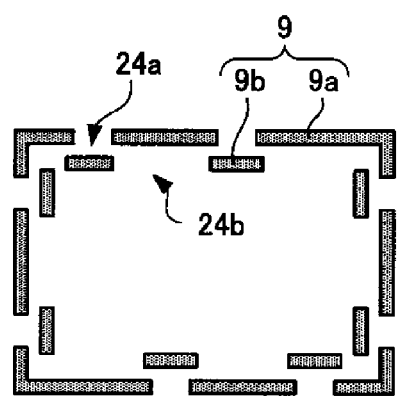

In FIG. 4C, the air gap 9 is formed by a first air gap 9a and a second air gap 9b. The air gap 9a is formed in the shape of a broken line enclosing the circuit formation region including the seal rings 8 and 18. The air gap 9b is disposed at the positions of breaks of the air gap 9a.

This example has a part where the circuit formation region within the air gap 9 and a region on the outside of the air gap 9 are continuous with each other through the breaks 24a of the first air gap 9a and the breaks 24b of the second air gap 9b. However, at least one of the first air gap 9a and the second air gap 9b is disposed in a radial direction from the circuit formation region inside the air gap 9. Thus essentially similar effects to those of FIG. 4A in which the air gap 9 is provided so as to be continuous can be obtained.

In addition, lead wiring or the like from the circuit formation region on the inside of the air gap 9 to the region on the outside of the air gap 9 can be arranged through the breaks 24a of the air gap 9a and the breaks 24b of the air gap 9b.

Figure 4D:
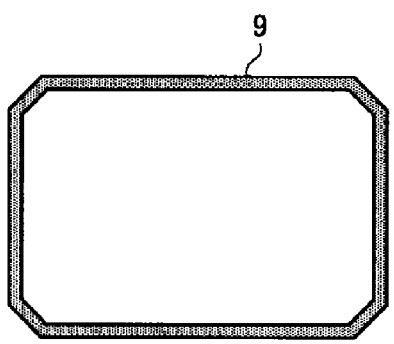

In addition, as shown in FIG. 4D, the air gap 9 may be formed in a chipped shape as compared with FIG. 4A. Chipping at the time of dicing can be prevented by the chipped shape approximating a curve. Incidentally, the air gap 9 may be formed in the shape of a closed curve enclosing the circuit formation region.

A TEG (test element group) may be formed on the same substrate as the semiconductor device at a time of trial production of the semiconductor device or a test on the semiconductor device. In such a case, the air gap 9 can be disposed as shown in FIG. 4E.

Figure 4E:
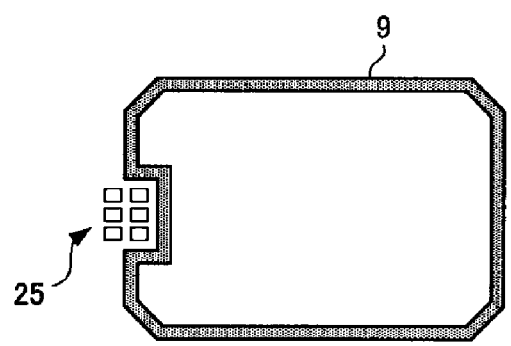

In FIG. 4E, at an arrangement position of the TEG 25, the air gap 9 is disposed along the perimeter of the TEG 25, and thereby the TEG 25 is situated outside the region enclosed by the air gap 9. When the air gap 9 is thus formed, a crack that has occurred reaches the TEG 25 first before reaching the air gap 9. The crack that has reached the TEG 25 is prevented from developing further with the TEG 25 serving as an obstacle.

That is, the TEG 25 can be used as a barrier against a crack.

Incidentally, even when the TEG 25 is disposed within the region enclosed by the air gap 9, the air gap 9 can prevent the development of a crack into the circuit formation region.

1-2. Method for Manufacturing Semiconductor Device

A method for manufacturing the semiconductor device 100 according to the present embodiment will be described in the following with reference to FIGS. 5A to 5D.

Figure 5A:
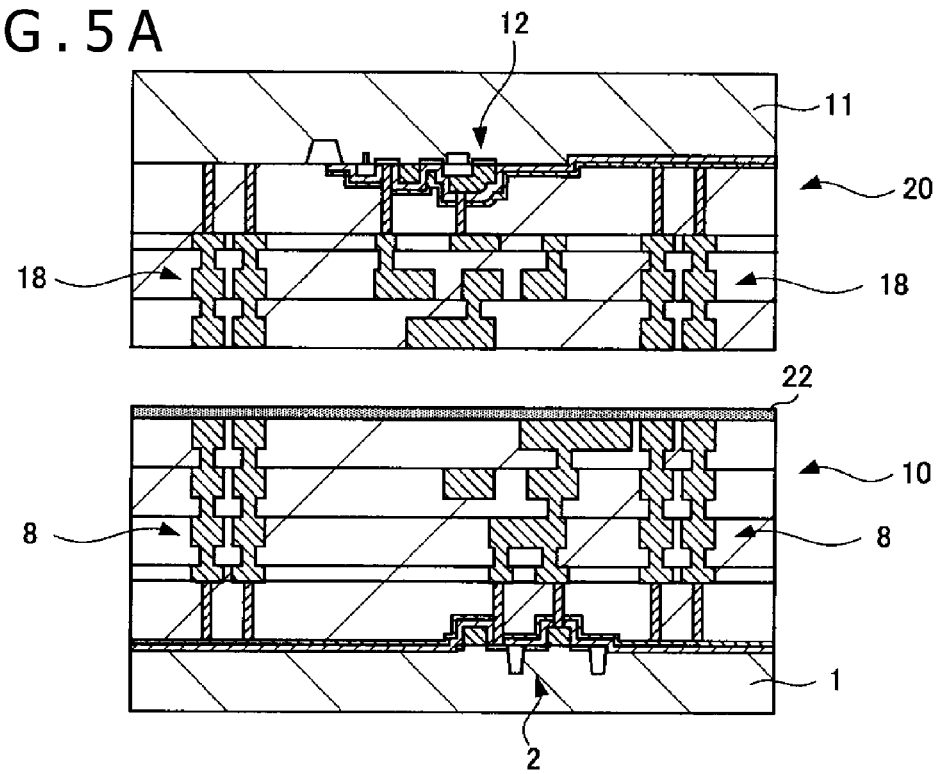
FIG. 5A is a diagram of assistance in explaining a state before a first laminate and a second laminate are bonded to each other.

First, as shown in FIG. 5A, a first laminate 10 having a functional element 2 on a principal surface of a substrate 1 and a second laminate 20 having a functional element 12 on a principal surface of a substrate 11 are prepared. A seal ring 8 is formed so as to enclose the functional element 2 as viewed from a direction perpendicular to the principal surface of the substrate 1. In addition, a seal ring 18 is formed so as to enclose the functional element 12 as viewed from a direction perpendicular to the principal surface of the substrate 11.

The first laminate 10 and the second laminate 20 may be manufactured by various known methods. A method for manufacturing the first laminate 10 and the second laminate 20 is not particularly limited.

Next, an adhesive layer 22 is formed by applying a coating of an adhesive such as a resin or the like to a bonding surface of the first laminate 10 or the second laminate 20, or a principal surface of the first laminate 10 on a side where the functional element 2 is provided to the substrate 1 in this case.

Figure 5B:
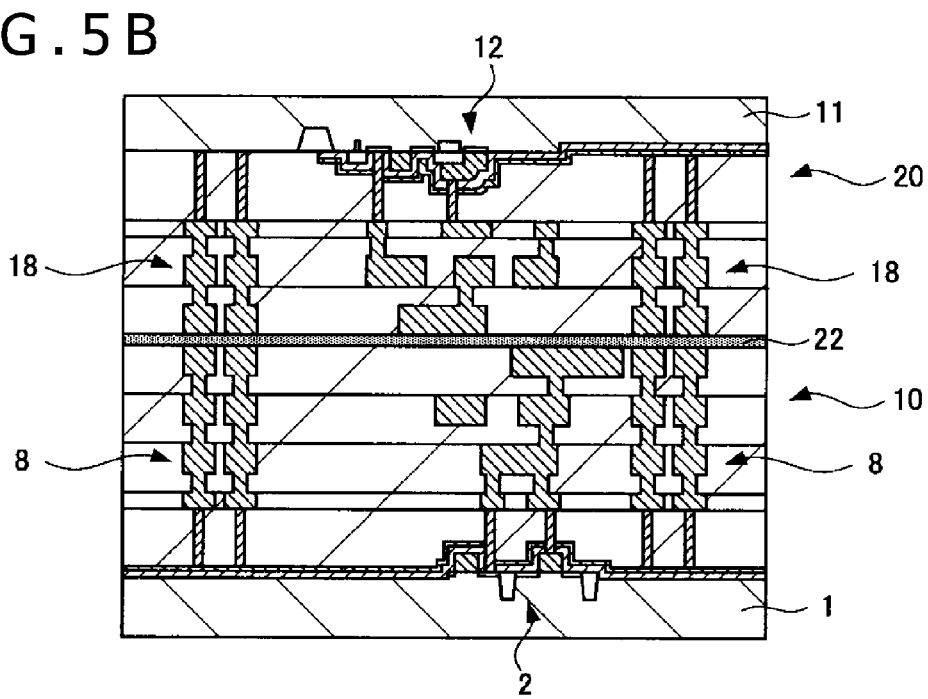
FIG. 5B is a diagram of assistance in explaining a state in which the first laminate and the second laminate are bonded to each other.

Then, as shown in FIG. 5B, the first laminate 10 and the second laminate 20 are bonded to each other by laminating the principal surface of the first laminate 10 on the side where the adhesive layer 22 is formed and the principal surface of the second laminate 20 on a side where the functional element 12 is formed on the substrate 11.

A method for the bonding may be another method without the use of an adhesive. For example, when the first laminate 10 and the second laminate 20 are in direct contact with each other, metal bonding, plasma bonding, glass anodic bonding, or the like can be used.

In addition, after the boding, the substrate 11 is ground to a predetermined thickness by CMP (Chemical Mechanical Polishing), BGR (back grinding), or the like.

Figure 5C:
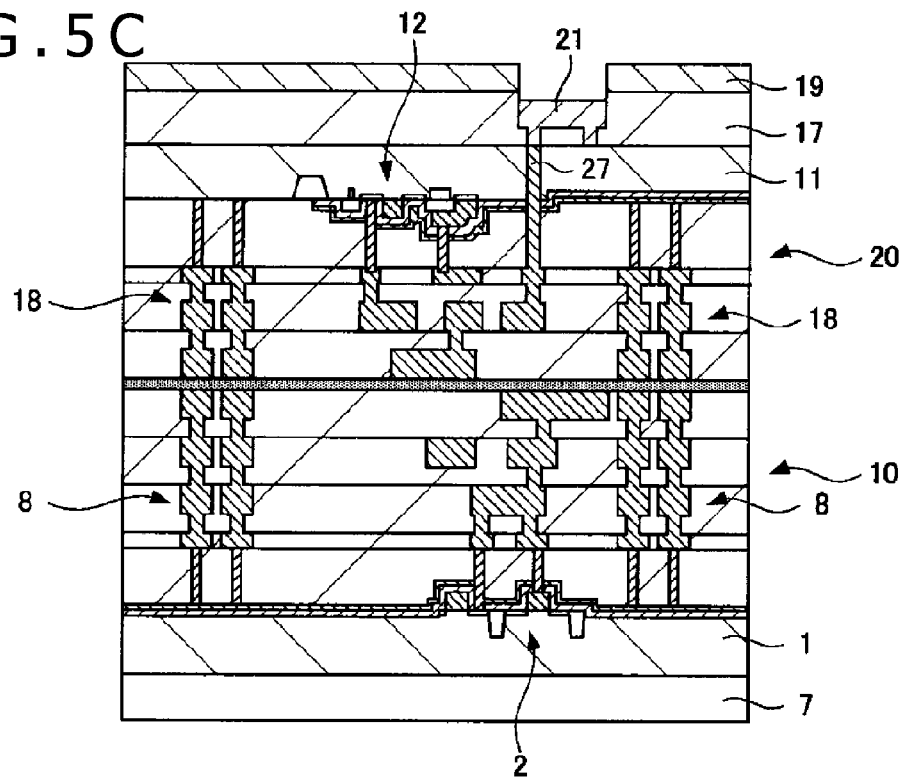
FIG. 5C is a diagram of assistance in explaining a state in which an insulating film, a terminal, and a passivation film are formed on a substrate on the side of the second laminate.

Next, as shown in FIG. 5C, a through hole 27 reaching wiring and an electrode in the second laminate 20 is formed by dry etching, for example. Then, an insulating film of $SiO_2$, SiN, SiON, TEOS, or the like is formed on an inner wall surface of the through hole 27 by CVD or the like to secure insulation.

The above-described insulating material deposited on the bottom part of the through hole 27 is removed by an electron beam, for example. Thereafter the inside of the through hole 27 is filled with a conductive material such as W, Al, or Cu, for example.

The above-described conductive material such as W, Al, Cu or the like deposited on the substrate 11 can be removed by using CMP or BGR.

Then, an insulating film 17 of $SiO_2$, SiN, SiON, or TEOS, for example, is formed on the substrate 11 to secure insulation of the substrate 11. Thereafter a terminal 21 is formed by Al, for example.

In addition, a passivation film 19 of a resin or the like is formed on the insulating film 17 except for a part where the terminal 21 is disposed.

In addition, an insulating film 7 provided to the substrate 1 may be formed in advance before the first laminate 10 is bonded or may be formed after the first laminate 10 is bonded, and is not particularly limited.

Figure 5D:
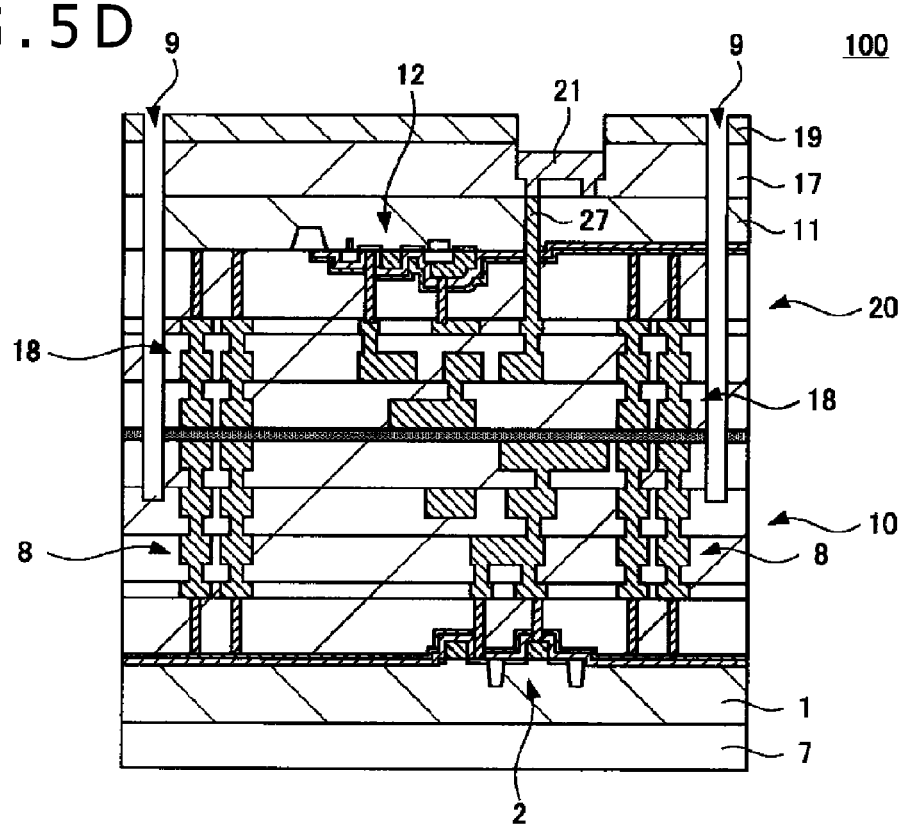
FIG. 5D is a diagram of assistance in explaining a state in which an air gap penetrating bonding surfaces is provided.

Thereafter, as shown in FIG. 5D, an air gap 9 penetrating the bonding surfaces of the first laminate 10 and the second laminate 20 is formed by using dry etching, wet etching, or the like. This air gap 9 is disposed on the outside of the seal ring 8 and the seal ring 18 as viewed from a direction perpendicular to the principal surface of the substrate 11 (the substrate 1 or the semiconductor device 100). The semiconductor device 100 is thereby completed.

In FIG. 5D, etching is performed from the side of the substrate 11, for example, and thus the air gap 9 has the shape of a groove having an opening in a surface on the side of the substrate 11.

The air gap 9 may be provided in the shape of a groove from the principal surface of the semiconductor device 100 on the side of the substrate 1.

Incidentally, there is not necessarily a need for the functional elements to be formed in both of the first laminate 10 and the second laminate 20, and only wiring may be formed in one of the laminates.

In addition, when the air gap penetrating the bonding surfaces is provided in the region on the outside of the seal ring of at least one of the laminates, the region on the inside of the seal ring can be protected from cracks.

2. First Example of Modification (Example of Different Bonding Surface)

In the first embodiment, the principal surfaces of the two laminates on the sides where the functional elements are formed on the substrates are bonded to each other. However, the bonded surfaces are not limited to this.

Figure 6:
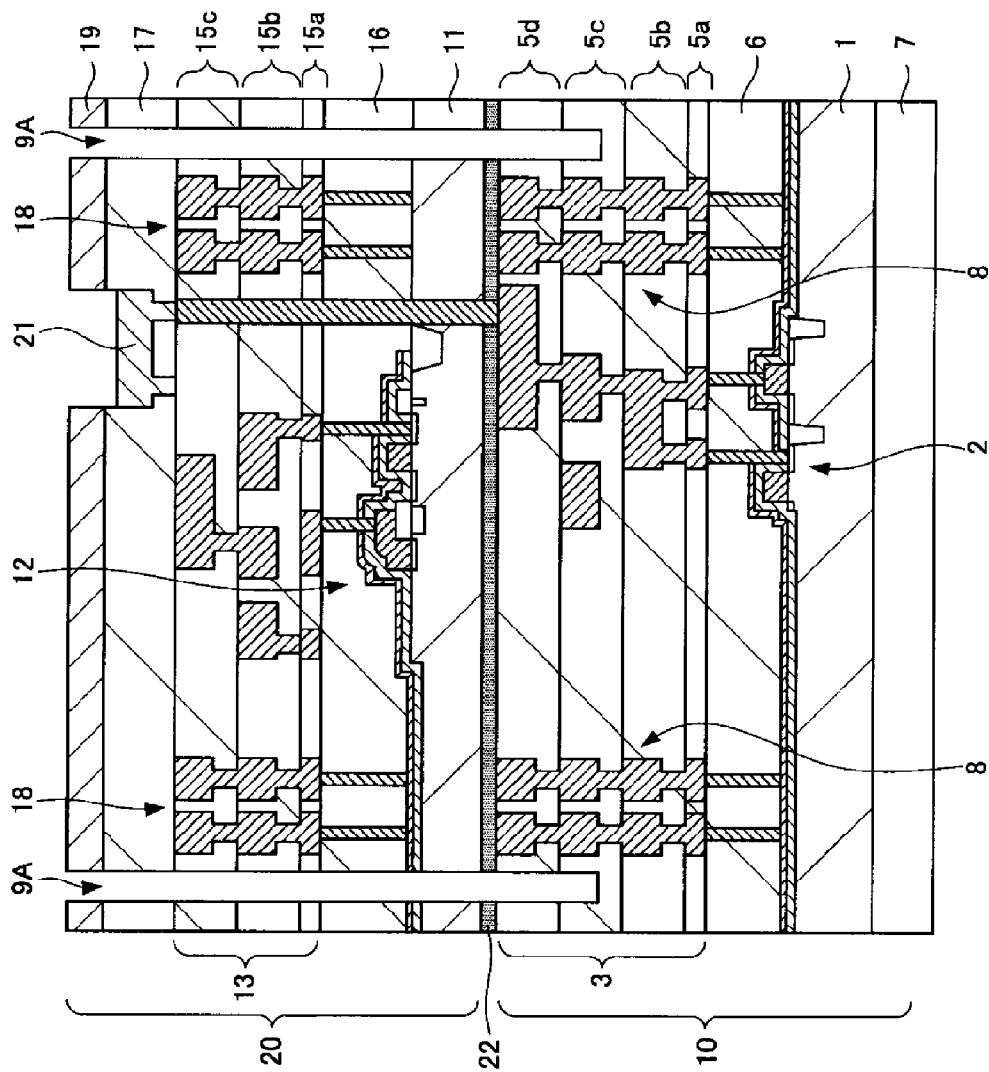
FIG. 6 is a schematic sectional view of a constitution of a semiconductor device according to a first example of modification of the present disclosure.

FIG. 6 is a sectional view of a schematic constitution of a semiconductor device 200 according to a first example of modification. In the following, parts corresponding to those of the first embodiment (see FIG. 1) are identified by the same reference numerals, and repeated description thereof will be avoided.

The semiconductor device 200 according to the present example of modification includes a first laminate 10 having a functional element 2 formed on a principal surface of a substrate 1 and a second laminate 20 having a functional element 12 formed on a principal surface of a substrate 11.

The first laminate 10 has a first to a fourth wiring layer 5a to 5d formed on the functional element 2 with a planarizing film (insulating film) 6 interposed between the first to fourth wiring layers 5a to 5d and the functional element 2, and has an insulating film 7 disposed on a principal surface of the substrate 1 which principal surface is on a side opposite from a side where the functional element 2 is formed. A seal ring 8 is disposed so as to enclose the periphery of the functional element 2 as viewed from a direction perpendicular to the principal surface of the substrate 1. The constitution of the first laminate 10 including these parts may be similar to the constitution shown in the first embodiment (see FIG. 1).

The second laminate 20 has wiring layers 15a to 15c formed on the functional element 12 with a planarizing film (insulating film) 16 interposed between the wiring layers 15a to 15c and the functional element 12. In addition, a seal ring 18 is disposed so as to enclose the functional element 12 as viewed from a direction perpendicular to the principal surface of the substrate 11.

The constitution including these parts may also be similar to the constitution shown in the first embodiment. However, in the present embodiment, an insulating film 17 is formed on the third wiring layer 15c, and a terminal 21 is formed on the insulating film 17. In addition, a passivation film 19 is disposed on a part of the insulating film 17 excluding a part where the terminal 21 is formed.

In addition, the principal surface of the first laminate 10 which principal surface is on a side where the functional element 2 is formed on the substrate 1 and the principal surface of the second laminate 20 which principal surface is on a side opposite from a side where the functional element 12 is formed on the substrate 11 are superposed on each other, and bonded to each other at the interface between the first laminate 10 and the second laminate 20.

The bonding of the first laminate 10 and the second laminate 20 may be performed by providing an adhesive layer 22 of a resin or the like, or may be performed by another method such as plasma bonding, metal bonding, glass anodic bonding, or the like.

It is to be noted that the present example of modification also has an air gap 9A penetrating the bonding surfaces of the first laminate 10 and the second laminate 20. This air gap 9A is formed in the shape of a groove having an opening in the surface of the second laminate 20. Such an air gap 9A can prevent cracks from developing along the bonding surfaces, and thus improve product quality.

In addition, the air gap 9A is formed on the outside of a circuit formation region including at least the functional elements 2 and 12, for example on the outside of the seal rings 8 and 18, as viewed from a direction perpendicular to the principal surface of the semiconductor device 200 (the substrate 1 or 11). It is thereby possible to prevent cracks from developing into the circuit formation region, and thus protect the circuit.

The air gap 9A may have various patterns shown in the first embodiment (see FIGS. 4A to 4E).

Thus, in the present example of modification, the bonding surfaces where the first laminate 10 and the second laminate 20 are bonded to each other are different from those of the first embodiment. That is, surfaces where the first laminate 10 and the second laminate 20 are bonded to each other can be selected appropriately.

When for example a MEMS actuator is used as the functional element 12 disposed in the second laminate 20, a movable part of the actuator needs to be exposed to the surface of the semiconductor device 200 so that a space for driving the movable part is secured. Thus, in such a case, the principal surface of the first laminate 10 which principal surface is on a side where the functional element 12 is not disposed on the substrate 11 is desirably bonded to the second laminate 20 as in the present example of modification.

In that case, the wiring layers are not formed over the actuator, but are arranged on the side of the first laminate 10, for example. Then, a transistor, a diode, or the like for driving the actuator, for example, can be disposed as the functional element 2 in the first laminate 10.

As for a manufacturing method, the semiconductor device 200 can be manufactured by a similar method to that described in the first embodiment by merely changing the surfaces where the first laminate 10 and the second laminate 20 are bonded to each other and the surface on which the insulating film 17, the passivation film 19, and the terminal 21 are formed.

Incidentally, the first laminate 10 and the second laminate 20 may be laminated by a method other than bonding. For example, the substrate 11 is formed on the wiring layer 3 of the first laminate 10 by vapor phase film formation or liquid phase film formation. For example, sputtering or the like may be used when the substrate 11 made of silicon is formed, or SOG (Spin On Glass) may be used when a glass substrate is formed.

Then, the second laminate 20 is laminated on the first laminate 10 by sequentially forming the functional element 12, the planarizing film 16, and the wiring layer 13 on the substrate 11.

Also in the case where the substrate 11 of the second laminate 20 is formed directly on the first laminate 10, an air gap 9 penetrating the interface between the first laminate 10 and the second laminate 20 is desirably formed in a similar manner. This can prevent cracks from developing along the interface between the first laminate 10 and the second laminate 20.

3. Second Example of Modification (Example of Bonding Three or More Laminates)

In addition, the number of laminates bonded to each other is not limited to two, but three or more laminates may be bonded to each other.

Figure 7:
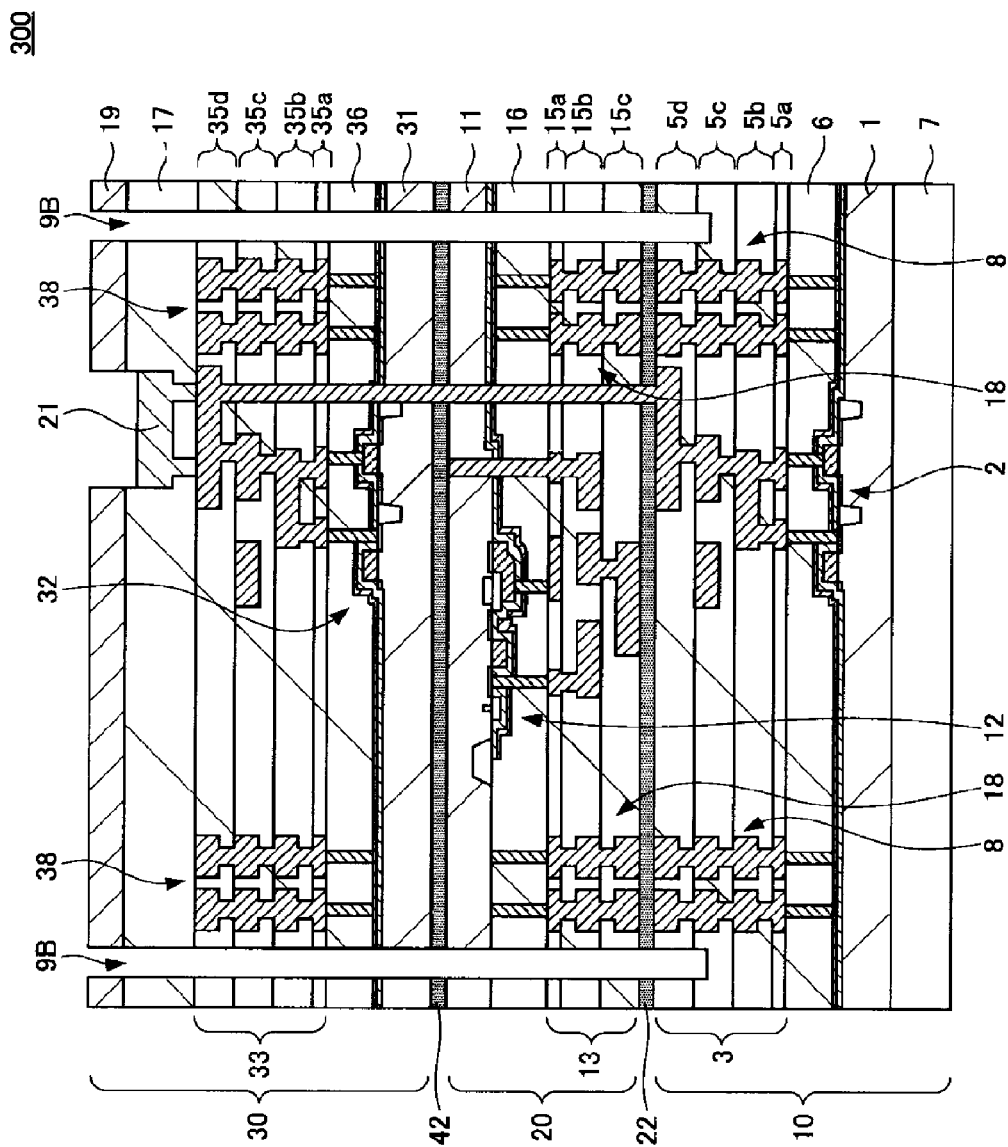
FIG. 7 is a schematic sectional view of a constitution of a semiconductor device according to a second example of modification of the present disclosure.

FIG. 7 is a schematic sectional view of a semiconductor device 300 according to a second example of modification. In the following, parts corresponding to those of the first embodiment (see FIG. 1) are identified by the same reference numerals, and repeated description thereof will be avoided.

The semiconductor device 300 according to the present example of modification includes a first laminate 10 having a functional element 2 formed on a substrate 1, a second laminate 20 having a functional element 12 formed on a substrate 11, and a third laminate 30 having a functional element 32 on a substrate 31.

The constitutions of the first laminate 10 and the second laminate 20 may be similar to those shown in the first embodiment, and are not particularly limited.

The third laminate 30 has a wiring layer 33 formed on the functional element 32 with a planarizing film (insulating film) 36 interposed between the wiring layer 33 and the functional element 32. The wiring layer 33 in this case is composed of a first wiring layer 35a, a second wiring layer 35b, a third wiring layer 35c, and a fourth wiring layer 35d.

A Si substrate, a glass substrate, or a metallic substrate, for example, can be used as the substrate 31. In addition, $SiO_2$, NSG, PSG, or TEOS, for example, is used for the planarizing film 36.

As with the wiring layers in the first embodiment, each of the first to fourth wiring layers 35a to 35d includes an interlayer insulating film made of a low dielectric constant material such as organosilica glass or the like or $SiO_2$, for example, and an interlayer insulating film made of SiCN or SiN.

The constitution of these parts in the third laminate 30 may be similar to the constitutions of the first laminate 10 and the second laminate 20, and is not particularly limited. However, in the present example of modification, an insulating film 17, a terminal 21, and a passivation film 19 are disposed on the wiring layer 33 of the third laminate 30.

Incidentally, there is not necessarily a need for all the laminates from the first laminates 10 to the third laminate 30 to have a functional element formed therein. It suffices to form a functional element in at least one of the laminates.

In the present example of modification, the principal surface of the first laminate 10 which principal surface is on the side of the wiring layer 3 is superposed on the principal surface of the second laminate 20 which principal surface is on the side of the wiring layer 13. Then, the first laminate 10 and the second laminate 20 are bonded to each other at an interface where the principal surface of the first laminate 10 on the side of the wiring layer 3 is superposed on the principal surface of the second laminate 20 on the side of the wiring layer 13. This bonding may be performed via an adhesive layer 22 of a resin or the like, or may be performed by another method such as plasma bonding, metal bonding, glass anodic bonding, or the like.

In addition, the principal surface of the second laminate 20 which principal surface is on the side of the substrate 11 is superposed on the principal surface of the third laminate 30 which principal surface is on the side of the substrate 31. Then, the second laminate 20 and the third laminate 30 are bonded to each other at an interface where the principal surface of the second laminate 20 on the side of the substrate 11 is superposed on the principal surface of the third laminate 30 on the side of the substrate 31.

This bonding may also be similarly performed via an adhesive layer 42 of a resin or the like, for example, or may be performed by another method such as plasma bonding, metal bonding, glass anodic bonding, or the like.

Thus, in the present example of modification, the semiconductor device 300 is formed by bonding the three laminates to each other. In this case, an air gap 9B is desirably provided so as to penetrate the bonding surfaces of the first laminate 10 and the second laminate 20 and the bonding surfaces of the second laminate 20 and the third laminate 30. This can prevent cracks from propagating through the bonding surfaces of the first laminate 10 and the second laminate 20 or the bonding surfaces of the second laminate 20 and the third laminate 30.

In addition, the air gap 9B is disposed on the outside of a circuit formation region including at least one of the functional elements 2, 12, and 32 as viewed from a direction perpendicular to the semiconductor device 300 (the substrate 1, 11, or 31). For example, in FIG. 7, the air gap 9B is disposed on the outside of seal rings 8, 18, and 38. This can prevent cracks from developing into the functional elements 2, 12, and 32 or the circuit formation region desired to be protected.

Incidentally, also in a case where a semiconductor device is formed by bonding four or more laminates to each other, cracks can be prevented from propagating through bonding surfaces by providing an air gap penetrating the bonding surfaces of the respective laminates. In addition, in each of the laminates, cracks can be prevented from developing into a region desired to be protected by providing the above-described air gap on the outside of the region desired to be protected.

In addition, the air gap 9B may have various patterns shown in the first embodiment (see FIGS. 4A to 4E).

As for a manufacturing method, the semiconductor device 300 can be manufactured by a similar method to that shown in the first embodiment (see FIGS. 5A to 5D) except that three or more laminates are bonded to each other and an air gap penetrating the bonding surfaces of the respective laminates is provided. There is no particular limitation as to whether the laminates are to be brought into electric contact with each other. Vias or the like may be formed to establish electric connection between the laminates as appropriate according to a need.

4. Second Embodiment (Example of Providing Air Gap Reaching Wiring)

Figure 8:
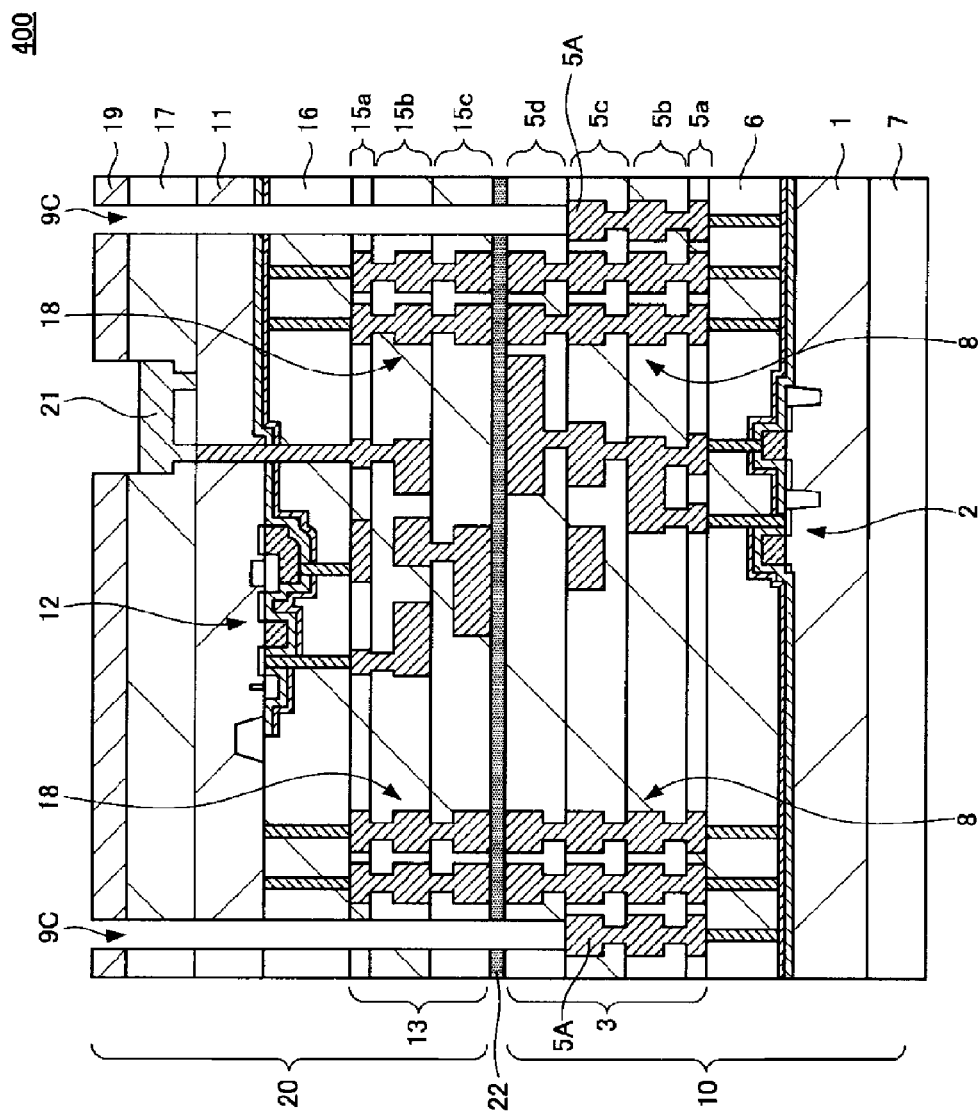
FIG. 8 is a schematic sectional view of a constitution of a semiconductor device according to a second embodiment of the present disclosure.

FIG. 8 is a schematic sectional view of a constitution of a semiconductor device 400 according to a second embodiment. In the following, parts corresponding to those of the first embodiment (see FIG. 1) are identified by the same reference numerals, and repeated description thereof will be avoided.

The semiconductor device 400 according to the present embodiment includes a first laminate 10 having a functional element 2 disposed on a principal surface of a substrate 1 and a second laminate 20 having a functional element 12 disposed on a substrate 11.

A basic structure of the first laminate 10 and the second laminate 20 may be the same as that of the semiconductor device 100 according to the first embodiment.

An air gap 9C in the present embodiment is provided so as to penetrate the bonding surfaces of the first laminate 10 and the second laminate 20. For example, the air gap 9C is formed in the shape of a groove having an opening in a principal surface of the semiconductor device 400 which principal surface is on the side of the second laminate 20.

However, the air gap 9C reaches wiring 5A in the first laminate 10, and the bottom surface of the groove formed by the air gap 9C coincides with the surface of the wiring 5A.

With such a constitution, when the air gap 9C is formed by dry etching or wet etching, for example, the wiring 5A can be used as an etching stopper, so that the depth of the air gap 9C can be controlled easily.

Incidentally, the wiring 5A that the air gap 9C reaches may be a part of wiring forming a seal ring 8, or only the wiring 5A may be disposed singly. In the semiconductor device according to the present embodiment, a dummy wiring or metal layer for an etching stopper may be partially disposed on the outside of the seal ring 8, and the air gap 9C may be allowed to reach the dummy wiring or metal layer.

As described above, also in the present embodiment, the air gap 9C is provided so as to penetrate the bonding surfaces of the first laminate 10 and the second laminate 20. It is therefore possible to prevent cracks from propagating through the bonding surfaces of the first laminate 10 and the second laminate 20.

In addition, the air gap 9C is disposed on the outside of a seal ring 18, that is, on the outside of a circuit formation region in the second laminate 20 as viewed from a direction perpendicular to the semiconductor device 400 (the substrate 1 or the substrate 11). This can prevent cracks from developing into the circuit formation region in the second laminate 20, and thus protect the functional element 12.

When the air gap 9C is made to reach a part of the wiring of the seal ring 8 in the first laminate 10, the air gap 9C is desirably made to reach wiring in an outermost region of the wiring forming the seal ring 8 as viewed from a direction perpendicular to the semiconductor device 400 (the substrate 1 or the substrate 11).

The semiconductor device 400 according to the present embodiment can be manufactured by a method similar to that shown in the first embodiment (FIGS. 5A to 5D) except that the air gap 9C is made to reach wiring in the first laminate 10.

Also in the present embodiment, surfaces where the first laminate 10 and the second laminate 20 are bonded to each other may be changed as in the first example of modification, and three or more laminates may be bonded to each other as in the second example of modification.

5. Third Embodiment (Example of Forming Seal Ring by Metallic Member Penetrating Substrate)

Figure 9:
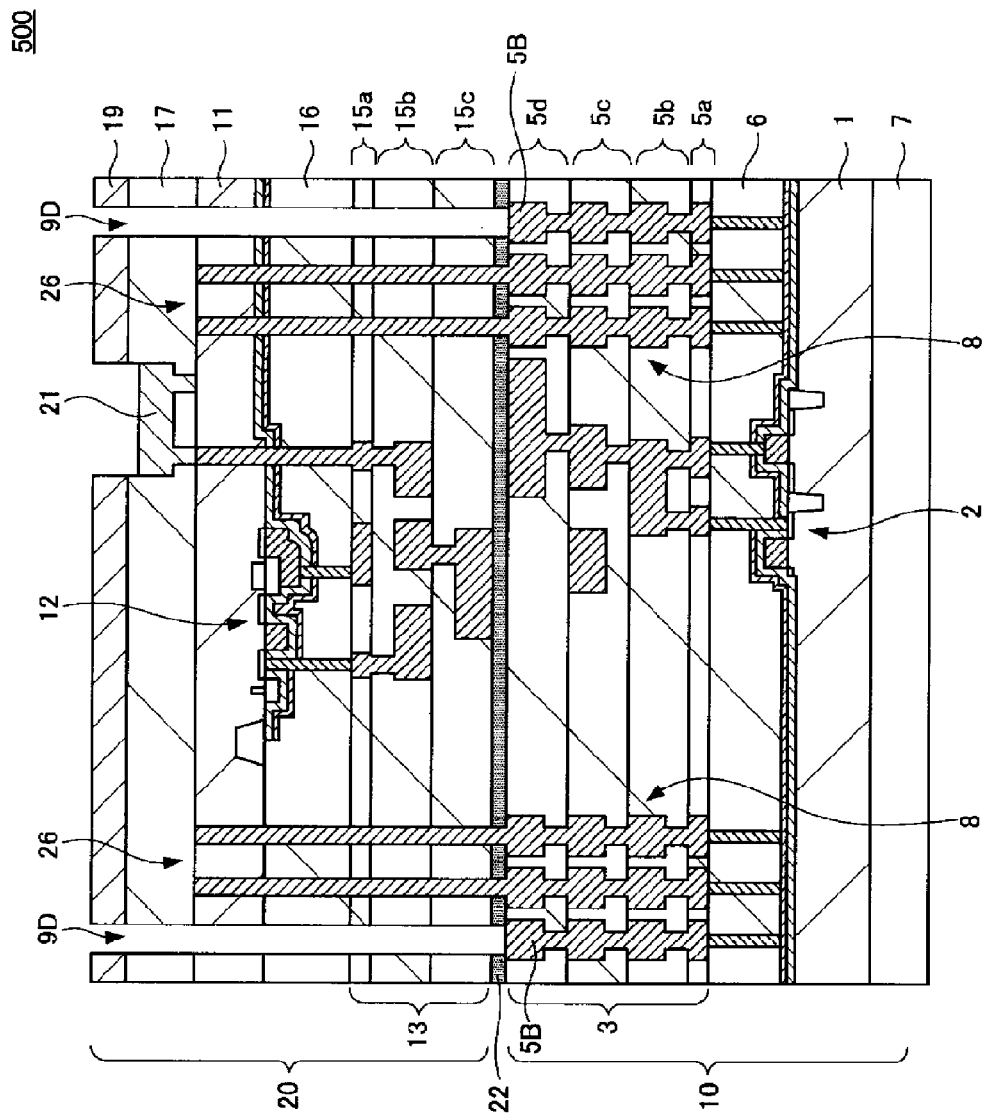
FIG. 9 is a schematic sectional view of a constitution of a semiconductor device according to a third embodiment of the present disclosure.

FIG. 9 is a schematic sectional view of a constitution of a semiconductor device 500 according to a third embodiment. Also in the present embodiment, parts corresponding to those of the first embodiment (see FIG. 1) are identified by the same reference numerals, and repeated description thereof will be avoided.

The semiconductor device 500 according to the present embodiment includes a first laminate 10 having a functional element 2 disposed on a principal surface of a substrate 1 and a second laminate 20 having a functional element 12 disposed on a substrate 11.

A basic structure of the first laminate 10 and the second laminate 20 and the like may be the same as that of the first embodiment.

However, the second laminate 20 includes a penetrating metallic member 26 penetrating the substrate 11 and a wiring layer 13 on the outside of a circuit formation region including the functional element 12 as viewed from a direction perpendicular to the principal surfaces of the first laminate 10 and the second laminate 20.

In the present embodiment, this penetrating metallic member 26 is formed in a similar manner to a so-called TSV (through silicon via), and is connected to a seal ring 8 in the first laminate 10.

Therefore usable as the penetrating metallic member 26 are for example W, Poly-Si, Cu, Al, Au, and Sn, or Ti, TiN, Ta, and Tan for which MCVD (Metal Chemical Vapor Deposition) techniques are established, or stack structures and alloys thereof.

In the second laminate 20, the penetrating metallic member 26 forms a seal ring.

Incidentally, the penetrating metallic member 26 forms a seal ring, and does not electrically connect a circuit on the side of the first laminate 10 to a circuit on the side of the second laminate 20 unlike a so-called TSV.

In addition, an air gap 9D is disposed on the outside of the penetrating metallic member 26 as viewed from a direction perpendicular to the principal surfaces of the first laminate 10 and the second laminate 20. For example, the air gap 9D is formed in the shape of a groove having an opening in a principal surface of the semiconductor device 500 which principal surface is on the side of the second laminate 20.

In addition, the air gap 9D reaches the seal ring 8 in the first laminate 10, and the bottom surface of the groove formed by the air gap 9D coincides with the surface of wiring 5B of the seal ring 8.

Thus, also in the present embodiment, because the air gap 9D penetrating the bonding surfaces of the first laminate 10 and the second laminate 20 is provided, cracks can be prevented from propagating through the bonding surfaces.

In addition, because cracks do not propagate through the bonding surfaces, the cracks can be prevented from developing into the circuit formation region in which the functional elements 2 and 12 are disposed.

In addition, because the seal ring in the second laminate 20 is formed by the penetrating metallic member 26 penetrating the substrate 11 and the wiring layer 13, the development of cracks can be prevented securely.

Incidentally, in the present embodiment, wiring connected with the penetrating metallic member 26 and the wiring 5B serving as the bottom surface of the groove formed by the air gap 9D in the first laminate 10 are arranged in a same fourth wiring layer 5*d*. Therefore the air gap 9D and a through hole for disposing the penetrating metallic member 26 can be formed simultaneously.

For example, after the first laminate 10 and the second laminate 20 are bonded to each other and before an insulating film 17 is formed, the through hole for the penetrating metallic member 26 and the air gap 9D are formed by dry etching, for example, from the side of the substrate 11 in the second laminate 20. Then, the seal ring 8 in the fourth wiring layer is used as an etching stopper for the through hole and the air gap 9D. Thereby the through hole and the air gap 9D can be formed simultaneously.

In addition, when a TSV to be connected to wiring arranged in the fourth wiring layer 5*d* in the first laminate is provided in the second laminate, the TSV, the through hole for the above-described penetrating metallic member 26, and the air gap 9D can be provided simultaneously.

Then, an insulating film of $SiO_2$, SiN, SiON, TEOS, or the like is formed on an inner wall surface of the through hole by CVD or the like to secure insulation.

The above-described insulating material deposited on the bottom part of the through hole is removed by an electron beam, for example. Thereafter the inside of the through hole is filled with a material as described above. Thereby the penetrating metallic member 26 is formed.

In other manufacturing steps, the semiconductor device 500 can be manufactured by a similar method to that shown in the first embodiment (FIGS. 5A to 5D).

Also in the present embodiment, surfaces where the first laminate 10 and the second laminate 20 are bonded to each other may be changed as in the first example of modification, and three or more laminates may be bonded to each other as in the second example of modification.

A pattern of formation of the air gap 9D as viewed from a direction perpendicular to the first laminate 10 and the second laminate 20 may also be similar to those of the first embodiment (see FIGS. 4A to 4E).

6. Fourth Embodiment (Example of Same Etching Stopper for Air Gap and Penetrating Metallic Member)

In addition, the wiring for the air gap etching stopper and the wiring connected with the penetrating metallic member may be connected to each other.

Figure 10:
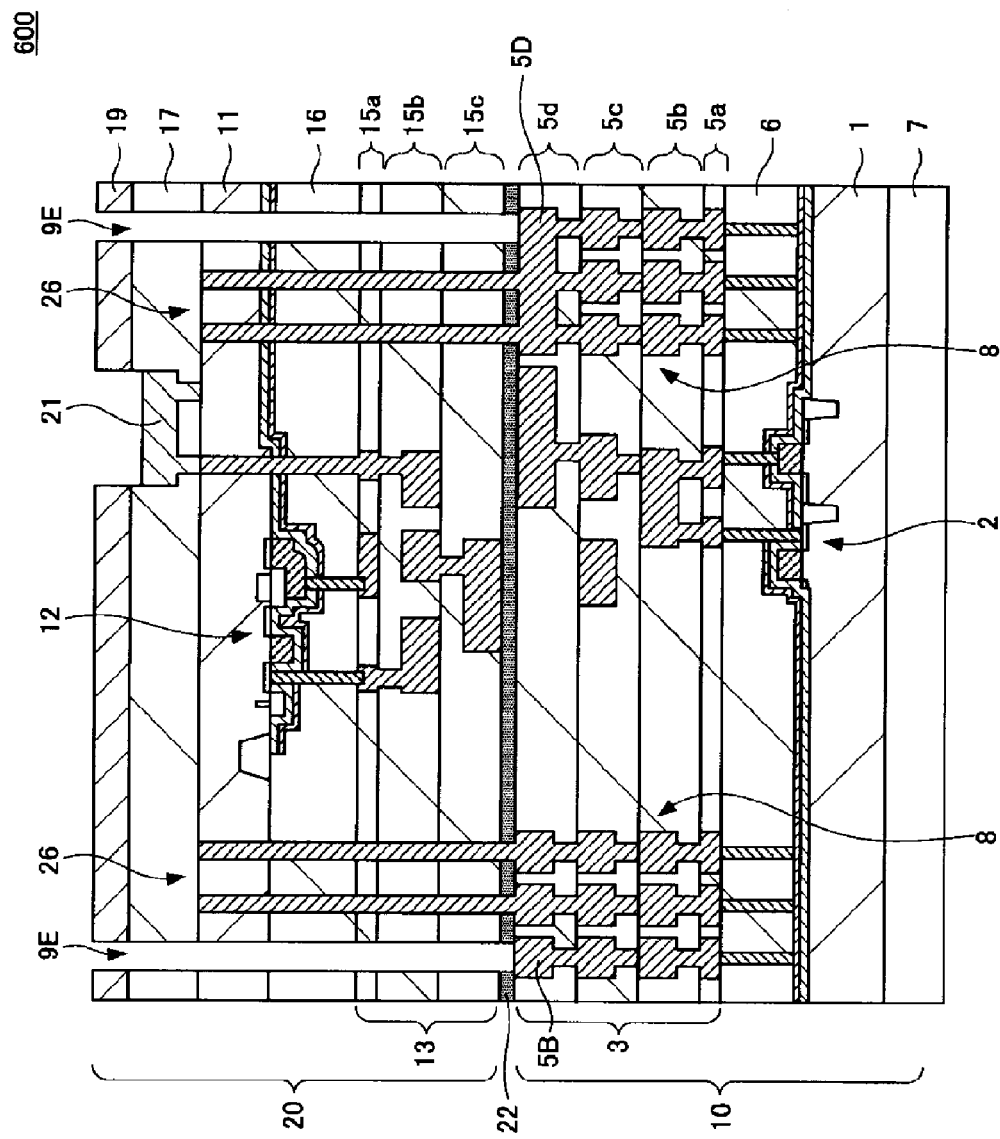
FIG. 10 is a schematic sectional view of a constitution of a semiconductor device according to a fourth embodiment of the present disclosure.

FIG. 10 is a schematic sectional view of a constitution of a semiconductor device 600 according to a fourth embodiment.

Also in the present embodiment, parts corresponding to those of the first embodiment (see FIG. 1) and the third embodiment (see FIG. 9) are identified by the same reference numerals, and repeated description thereof will be avoided.

The semiconductor device 600 according to the present embodiment includes a first laminate 10 having a functional element 2 formed on a principal surface of a substrate 1 and a second laminate 20 having a functional element 12 formed on a substrate 11.

A basic constitution of the first laminate 10 and the second laminate 20 may be similar to the constitution shown in the first embodiment (see FIG. 1).

The first laminate 10 has a seal ring 8 formed so as to enclose the functional element 2 as viewed from a direction perpendicular to a principal surface of the first laminate 10.

The second laminate 20 has a penetrating metallic member 26 disposed so as to enclose the functional element 12 as viewed from a direction perpendicular to a principal surface of the second laminate 20. This penetrating metallic member 26 is connected to the seal ring 8 in the first laminate 10.

In addition, an air gap 9E is disposed on the outside of the penetrating metallic member 26 as viewed from a direction perpendicular to the first laminate 10 and the second laminate 20. This air gap 9E is formed in the shape of a groove having an opening on the side of the second laminate 20 in the semiconductor device 600, and reaches wiring forming the seal ring 8 in the first laminate 10.

The constitution of these parts may be similar to the constitution of the semiconductor device 500 described in the third embodiment (see FIG. 9).

That is, also in the present embodiment, because the air gap 9E reaching the seal ring 8 is provided, cracks can be prevented from propagating through the bonding surfaces of the first laminate 10 and the second laminate 20. In addition, because cracks do not propagate through the bonding surfaces, the cracks can be prevented from developing into a circuit formation region in which the functional elements 2 and 12 are disposed.

However, in the present embodiment, a pad 5D is formed by connecting the wiring connected with the penetrating metallic member 26 and the wiring reached by the air gap 9E in the seal ring 8 to each other. When the wiring connected with the penetrating metallic member 26 and the wiring reached by the air gap 9E are thus connected to each other, the area of a metal (wiring) in the uppermost surface (wiring layer 5*d*) of the seal ring 8 is increased.

Thus, when this pad 5D is used as an etching stopper at a time of providing a through hole for the penetrating metallic member 26 and the air gap 9E, the large area of the pad 5D can relax an alignment accuracy considered to be necessary at a time of etching. In addition, an alignment accuracy at a time of bonding the first laminate 10 and the second laminate 20 can be similarly relaxed.

It is therefore possible to avoid an increase in chip size as a result of considering a margin for alignment displacements.

In the present embodiment, the semiconductor device 600 can be manufactured in a similar manner to the third embodiment except that the pad 5D is formed by connecting pieces of wiring of the seal ring 8 in the wiring layer 5*d* to each other when a wiring layer 3 in the first laminate 10 is formed.

Also in the present embodiment, surfaces where the first laminate 10 and the second laminate 20 are bonded to each other may be changed as in the first example of modification, and three or more laminates may be bonded to each other as in the second example of modification.

Further, a pattern of formation of the air gap 9E as viewed from a direction perpendicular to the first laminate 10 and the second laminate 20 may be similar to those of the first embodiment (see FIGS. 4A to 4E).

7. Fifth Embodiment (Example of Providing Air Gap Only in Proximity to Bonding Surface)

7-1. Constitution of Semiconductor Device

In the embodiments thus far, an air gap in the shape of a groove having an opening in a surface of a semiconductor device is provided. However, it suffices for an air gap according to an embodiment of the present disclosure to penetrate through the bonding surfaces of laminates, or it suffices for the boundary of the air gap to coincide with the bonding surfaces. The air gap does not necessarily need to have an opening in a surface of the semiconductor device.

Figure 11:
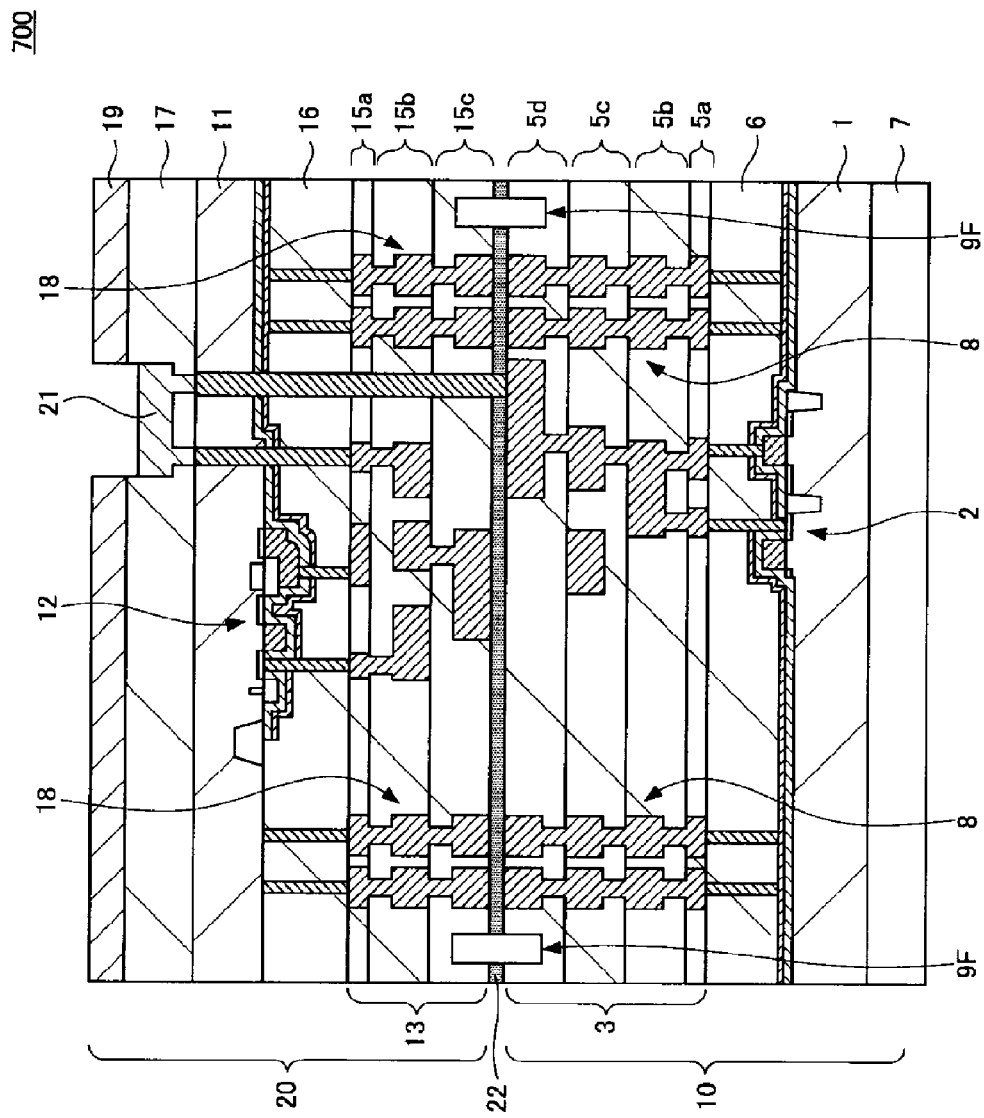
FIG. 11 is a schematic sectional view of a constitution of a semiconductor device according to a fifth embodiment of the present disclosure.

FIG. 11 is a schematic sectional view of a constitution of a semiconductor device 700 according to a fifth embodiment.

Also in the present embodiment, parts corresponding to those of the first embodiment (see FIG. 1) and the third embodiment (see FIG. 9) are identified by the same reference numerals, and repeated description thereof will be avoided.

The semiconductor device 700 according to the present embodiment includes a first laminate 10 having a functional element 2 formed on a principal surface of a substrate 1 and a second laminate 20 having a functional element 12 formed on a substrate 11.

A constitution of the first laminate 10 and the second laminate 20 may be similar to the constitution shown in the first embodiment.

In addition, a method of bonding the first laminate 10 and the second laminate 20 to each other may be similar to the method shown in the first embodiment.

An air gap 9F is disposed on the outside of seal rings 8 and 18 as viewed from a direction perpendicular to principal surfaces of the first laminate 10 and the second laminate 20. This air gap 9F is disposed so as to penetrate through the bonding surfaces of the first laminate 10 and the second laminate 20. Incidentally, one end of the air gap 9F may coincide with the bonding surfaces of the first laminate 10 and the second laminate 20.

In the present embodiment, the air gap 9F does not have an opening in a surface of the semiconductor device 700, but is a closed space disposed within the semiconductor device 700.

However, because the air gap 9F penetrates the bonding surfaces of the first laminate 10 and the second laminate 20, the air gap 9F can release the stress of cracks, and thus prevent the cracks from propagating through the bonding surfaces.

In addition, because cracks do not propagate through the bonding surfaces, the cracks can be prevented from developing into a circuit formation region situated on the inside of the air gap 9F as viewed from a direction perpendicular to the principal surfaces of the first laminate 10 and the second laminate 20.

Also in the present embodiment, surfaces where the first laminate 10 and the second laminate 20 are bonded to each other may be changed as in the first example of modification, and three or more laminates may be bonded to each other as in the second example of modification.

Further, a pattern of formation of the air gap 9F as viewed from a direction perpendicular to the first laminate 10 and the second laminate 20 may be similar to those of the first embodiment (see FIGS. 4A to 4E).

7-2. Method for Manufacturing Semiconductor Device

The semiconductor device 700 according to the present embodiment can be manufactured as follows. FIGS. 12A to 12D are diagrams of assistance in explaining a method for manufacturing the semiconductor device 700 according to the present embodiment.

Figure 12A:
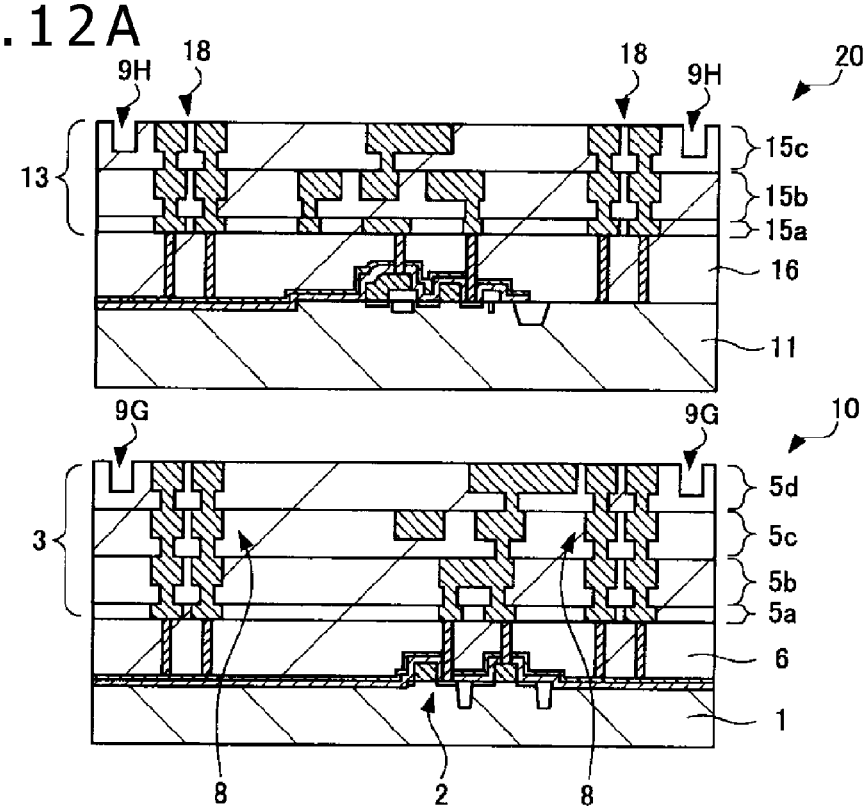
FIG. 12A is a diagram of assistance in explaining a state in which an air gap in the shape of a groove is disposed in principal surfaces of a first laminate and a second laminate.

First, as shown in FIG. 12A, a first laminate 10 having a functional element 2 on a principal surface of a substrate 1 and a second laminate 20 having a functional element 12 on a principal surface of a substrate 11 are prepared.

A planarizing film 6 is formed on the functional element 2 on the substrate 1. Thereafter a first to a fourth wiring layer 5a to 5d are sequentially formed. In addition, a planarizing film 16 is formed on the functional element 12 on the substrate 11. Thereafter a first to a third wiring layer 15a to 15c are sequentially formed.

In addition, a seal ring 8 is formed so as to enclose the functional element 2 as viewed from a direction perpendicular to a principal surface of the substrate 1. In addition, a seal ring 18 is formed so as to enclose the functional element 12 as viewed from a direction perpendicular to a principal surface of the substrate 11.

The first laminate 10 and the second laminate 20 may be manufactured by various known methods. A method for manufacturing the first laminate 10 and the second laminate 20 is not particularly limited.

Then, an air gap 9G in the shape of a groove is formed on the outside of the seal ring 8 on the side of a wiring layer 3 in the first laminate 10 by wet etching or dry etching, for example.

Similarly, an air gap 9H in the shape of a groove is formed on the outside of the seal ring 18 in a principal surface of the second laminate 20 on the side of a wiring layer 13 by wet etching, dry etching, or the like.

Figure 12B:
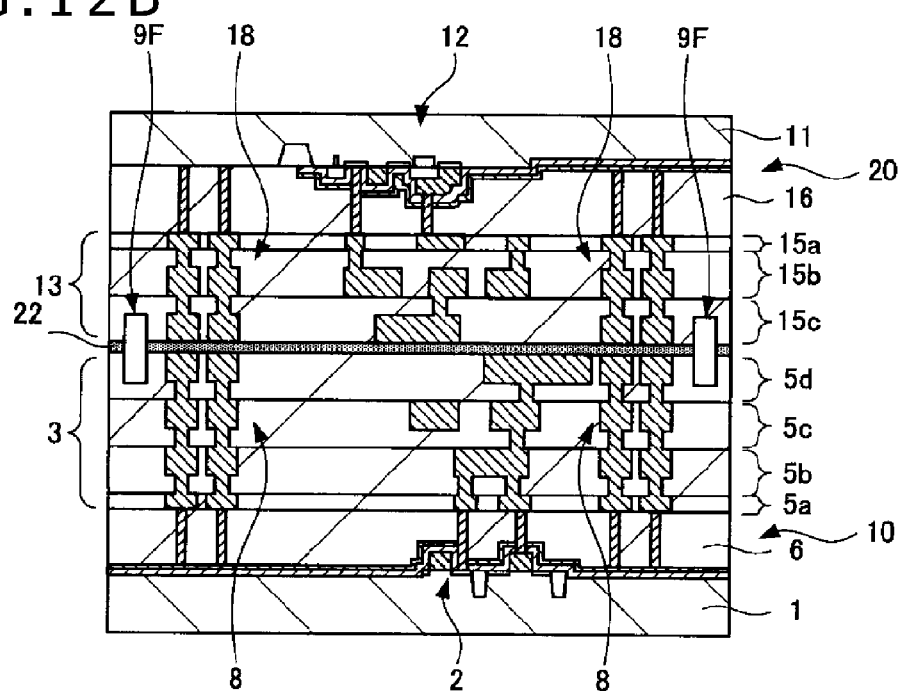
FIG. 12B is a diagram of assistance in explaining a state in which the first laminate and the second laminate are bonded to each other.

Next, as shown in FIG. 12B, the principal surface of the first laminate 10 in which principal surface the air gap 9G is disposed and the principal surface of the second laminate 20 in which principal surface the air gap 9H is disposed are bonded to each other.

At this time, the air gap 9G and the air gap 9H are aligned with each other, and bonded to each other such that the air gap 9G and the air gap 9H communicate with each other. Thereby an air gap 9F penetrating the bonding surfaces of the first laminate 10 and the second laminate 20 is formed.

A method for the bonding is not limited to an adhesive, but another method may be used. For example, when the first laminate 10 and the second laminate 20 are in direct contact with each other, metal bonding, plasma bonding, glass anodic bonding, or the like can be used.

In addition, after the boding, the substrate 11 is ground to a predetermined thickness by CMP (Chemical Mechanical Polishing), BGR (back grinding), or the like.

Figure 12C:
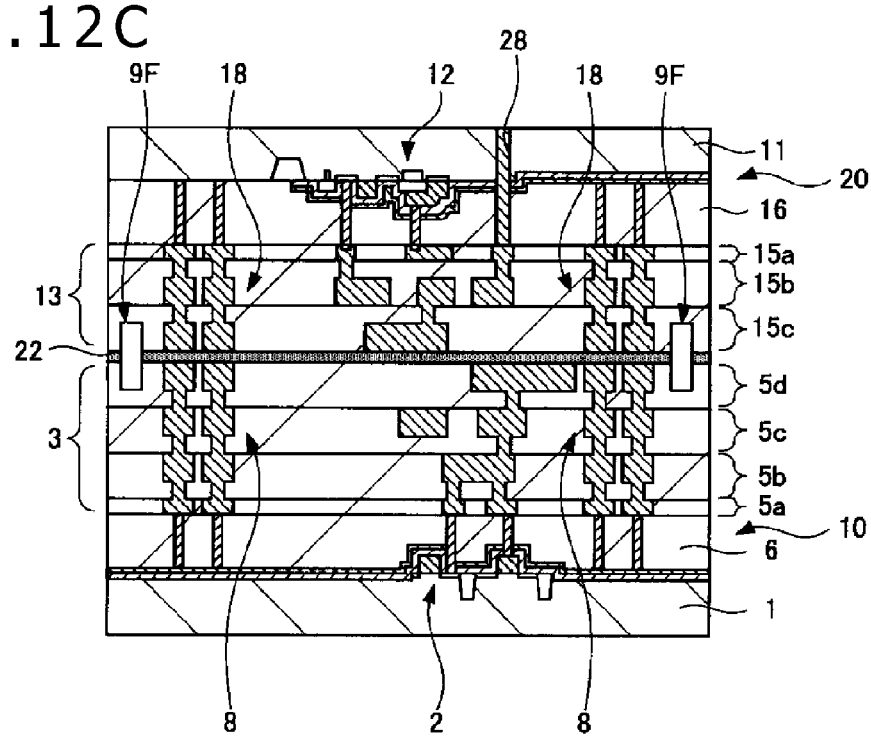
FIG. 12C is a diagram of assistance in explaining a state in which a penetrating metallic member penetrating the substrate of the second laminate is disposed.

Next, as shown in FIG. 12C, a via hole 28 reaching wiring and an electrode in the second laminate 20 is formed from the side of the substrate 11 by dry etching, for example. Then, an insulating film of $SiO_2$, SiN, SiON, TEOS, or the like is formed on an inner wall surface of the via hole 28 by CVD or the like to secure insulation.

The above-described insulating material deposited on the bottom part of the via hole 28 is removed by an electron beam, for example. Thereafter the inside of the via hole 28 is filled with a conductive material such as W, Al, or Cu, for example. The above-described conductive material such as W, Al, Cu or the like deposited on the substrate 11 can be removed by using CMP or BGR.

Figure 12D:
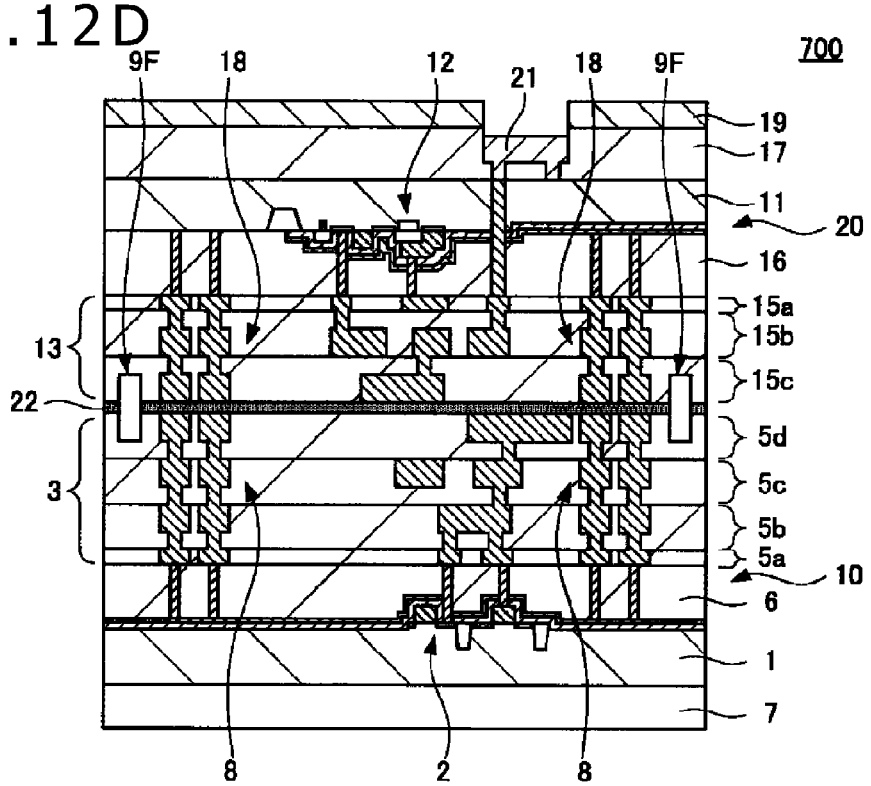
FIG. 12D is a diagram of assistance in explaining a state in which an insulating film, a terminal, and a passivation film are formed on the substrate of the first laminate.

Then, as shown in FIG. 12D, an insulating film 17 of $SiO_2$, SiN, SiON, or TEOS, for example, is formed on the substrate 11 to secure insulation of the substrate 11. Thereafter a terminal 21 is formed by Al, for example.

In addition, a passivation film 19 of a resin or the like is formed on the insulating film 17 except for a part where the terminal 21 is disposed. Thereby the semiconductor device 700 is completed.

In addition, an insulating film 7 to be provided to the substrate 1 is similarly formed by using $SiO_2$, SiN, SiON, or TEOS, for example. The insulating film 7 may be formed in advance before the first laminate 10 is bonded or may be formed after the first laminate 10 is bonded, and is not particularly limited.

Incidentally, there is not necessarily a need for the functional elements to be formed in both of the first laminate 10 and the second laminate 20, and only wiring may be formed in one of the laminates.

In addition, even in a case where the bonding surfaces where the first laminate 10 and the second laminate 20 are bonded to each other are changed, the semiconductor device 700 can be manufactured by similarly forming air gaps in the shape of a groove in the bonding surfaces and aligning the first laminate 10 and the second laminate 20 with each other and bonding the first laminate 10 and the second laminate 20 to each other such that the respective air gaps of the first laminate 10 and the second laminate 20 communicate with each other.

Also in a case where three or more laminates are bonded to each other, the semiconductor device 700 can be manufactured by forming air gaps in the shape of a groove in the respective bonding surfaces of the laminates, aligning the laminates with each other, and bonding the laminates to each other.

Embodiments of a semiconductor device and a method for manufacturing the same have been described above. The present disclosure is not limited to the foregoing embodiments, but includes various forms conceivable without departing from the spirit of the present disclosure described in claims.

In addition, the present disclosure can also adopt the following constitutions.

(1) A semiconductor device including:
a first laminate having a wiring layer formed on a substrate;
a second laminate having a wiring layer formed on a substrate, a principal surface of the second laminate being bonded to a principal surface of the first laminate;
a functional element disposed in at least one of the first laminate and the second laminate; and
an air gap penetrating the bonded surfaces of the first laminate and the second laminate, the air gap being disposed on an outside of a circuit formation region including the functional element in at least one of the first laminate and the second laminate as viewed from a direction perpendicular to the principal surfaces of the first laminate and the second laminate.

(2) The semiconductor device according to (1),
wherein the air gap is a groove penetrating the second laminate.

(3) The semiconductor device according to (1) or (2), further including a seal ring enclosing the circuit formation region of the first laminate and the second laminate as viewed from a direction perpendicular to the principal surface of the first laminate,
wherein the groove is disposed on an outside of the seal ring.

(4) The semiconductor device according to (3),
wherein a bottom surface of the groove coincides with a surface of wiring within the first laminate.

(5) The semiconductor device according to (4), further including a penetrating metallic member penetrating the substrate of the second laminate and the bonded surfaces,
wherein the penetrating metallic member is connected to wiring in a same layer as the wiring coinciding with the bottom surface of the groove.

(6) The semiconductor device according to (5),
wherein the penetrating metallic member forms the seal ring.

(7) The semiconductor device according to one of (3) to (6),
wherein the groove is formed so as to enclose the seal ring as viewed from a direction perpendicular to the principal surface of the first laminate.

(8) The semiconductor device according to one of (3) to (7),
wherein the seal ring is formed in both of the first laminate and the second laminate.

(9) A method for manufacturing a semiconductor device, the method including:
forming a first laminate having a wiring layer formed on a substrate, a second laminate having a wiring layer formed on a substrate, and a functional element disposed in at least one of the first laminate and the second laminate;
bonding a principal surface of the first laminate and a principal surface of the second laminate to each other; and
disposing a groove penetrating the bonded surfaces of the first laminate and the second laminate and having an opening in a principal surface of one of the first laminate and the second laminate, the principal surface being on an opposite side from the bonded surface of one of the first laminate and the second laminate, on an outside of a circuit formation region of the first laminate and the second laminate.

(10) A method for manufacturing a semiconductor device, the method including:
forming a first laminate having a wiring layer formed on a substrate, a second laminate having a wiring layer formed on a substrate, and a functional element disposed in at least one of the first laminate and the second laminate;
forming a groove in a principal surface of the first laminate and a groove in a principal surface of the second laminate on an outside of a circuit formation region of the first laminate and the second laminate; and
performing alignment such that the groove disposed in the first laminate and the groove disposed in the second laminate communicate with each other, and bonding the principal surfaces of the first laminate and the second laminate to each other.

(11) The method for manufacturing the semiconductor device according to (9) or (10),
wherein a seal ring enclosing the circuit formation region of the first laminate and the second laminate as viewed from a direction perpendicular to the principal surface of the first laminate is formed, and the groove is disposed on an outside of the seal ring.

The present disclosure contains subject matter related to that disclosed in Japanese Priority Patent Application JP 2011-065494 filed in the Japan Patent Office on Mar. 24, 2011, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A semiconductor device comprising:
a first laminate having a wiring layer formed on a substrate;
a second laminate having a wiring layer formed on a substrate, a principal surface of the second laminate being bonded to a principal surface of said first laminate;
a functional element disposed in at least one of said first laminate and said second laminate;
an air gap penetrating an interface between said first laminate and said second laminate, the air gap being disposed on an outside of a circuit formation region including said functional element in at least one of said first laminate and said second laminate as viewed from a direction perpendicular to the principal surfaces of said first laminate and said second laminate, wherein said air gap is a groove penetrating said second laminate;
a seal ring enclosing the circuit formation region of said first laminate and said second laminate as viewed from a direction perpendicular to said principal surface of said first laminate, wherein said groove is disposed on an outside of said seal ring, and a bottom surface of said groove coincides with a surface of wiring within said first laminate; and a penetrating metallic member penetrating said substrate of said second laminate and said interface, wherein said penetrating metallic member is connected to wiring in a same layer as said wiring coinciding with the bottom surface of said groove.

2. The semiconductor device according to claim 1, wherein said penetrating metallic member forms the seal ring.

3. The semiconductor device according to claim 1, wherein said groove is formed so as to enclose said seal ring as viewed from a direction perpendicular to the principal surface of said first laminate.

4. The semiconductor device according to claim 3, wherein said seal ring is formed in both of said first laminate and said second laminate.

5. A method for manufacturing a semiconductor device, the method comprising:

forming a first laminate having a wiring layer formed on a substrate, a second laminate having a wiring layer formed on a substrate, and a functional element disposed in at least one of said first laminate and said second laminate;

bonding a principal surface of said first laminate and a principal surface of said second laminate to each other;

disposing a groove penetrating an interface between said first laminate and said second laminate and having an opening in a principal surface of one of said first laminate and said second laminate, the principal surface being on an opposite side from the bonded surface of one of said first laminate and said second laminate, on an outside of a circuit formation region of said first laminate and said second laminate;

forming a seal ring enclosing the circuit formation region of said first laminate and said second laminate as viewed from a direction perpendicular to said principal surface of said first laminate, wherein said groove is disposed on an outside of said seal ring, and a bottom surface of said groove coincides with a surface of wiring within said first laminate; and forming a penetrating metallic member penetrating said substrate of said second laminate and said interface, wherein said penetrating metallic member is connected to wiring in a same layer as said wiring coinciding with the bottom surface of said groove.

6. A method for manufacturing a semiconductor device, the method comprising:

forming a first laminate having a wiring layer formed on a substrate, a second laminate having a wiring layer formed on a substrate, and a functional element disposed in at least one of said first laminate and said second laminate;

forming a groove in a principal surface of said first laminate and a groove in a principal surface of said second laminate on an outside of a circuit formation region of said first laminate and said second laminate;

performing alignment such that said groove disposed in said first laminate and said groove disposed in said second laminate communicate with each other, and bonding said principal surfaces of said first laminate and said second laminate to each other;

forming a seal ring enclosing the circuit formation region of said first laminate and said second laminate as viewed from a direction perpendicular to said principal surface of said first laminate, wherein said groove is disposed on an outside of said seal ring, and a bottom surface of said groove coincides with a surface of wiring within said first laminate; and forming a penetrating metallic member penetrating said substrate of said second laminate and said interface, wherein said penetrating metallic member is connected to wiring in a same layer as said wiring coinciding with the bottom surface of said groove.

7. The method according to claim 5, wherein said penetrating metallic member forms the seal ring.

8. The method according to claim 5, wherein said groove is formed so as to enclose said seal ring as viewed from a direction perpendicular to the principal surface of said first laminate.

9. The method according to claim 8, wherein said seal ring is formed in both of said first laminate and said second laminate.

10. The method according to claim 6, wherein said penetrating metallic member forms the seal ring.

11. The method according to claim 6, wherein said groove is formed so as to enclose said seal ring as viewed from a direction perpendicular to the principal surface of said first laminate.

12. The method according to claim 11, wherein said seal ring is formed in both of said first laminate and said second laminate.

* * * * *